United States Patent
Fenouillet-Beranger et al.

(10) Patent No.: US 10,115,637 B2
(45) Date of Patent: Oct. 30, 2018

(54) METHOD FOR FABRICATING AUTO-ALIGNED INTERCONNECTION ELEMENTS FOR A 3D INTEGRATED CIRCUIT

(71) Applicant: COMMISSARIAT A L'ENERGIE ATOMIQUE ET AUX ENERGIES ALTERNATIVES, Paris (FR)

(72) Inventors: Claire Fenouillet-Beranger, Voiron (FR); Benoit Mathieu, Grenoble (FR); Philippe Coronel, Barraux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/820,811

(22) Filed: Nov. 22, 2017

(65) Prior Publication Data
US 2018/0158736 A1 Jun. 7, 2018

(30) Foreign Application Priority Data
Nov. 23, 2016 (FR) ..................................... 16 61386

(51) Int. Cl.
*H01L 21/00* (2006.01)
*H01L 21/84* (2006.01)
(Continued)

(52) U.S. Cl.
CPC .... *H01L 21/8221* (2013.01); *H01L 21/02134* (2013.01); *H01L 21/268* (2013.01);
(Continued)

(58) Field of Classification Search
CPC ......... H01L 33/00; H01L 33/06; H01L 33/08; H01L 33/12; H01L 33/40; H01S 5/34
(Continued)

(56) References Cited

U.S. PATENT DOCUMENTS 4,596,604 A 6/1986 Akiyama et al.
5,075,246 A * 12/1991 Re .................... H01L 21/8221
148/DIG. 14
(Continued)

OTHER PUBLICATIONS

U.S. Appl. No. 14/375,858, filed Jul. 31, 2014, 2014/0374930 A1, Olivier Dellea, et al.
(Continued)

*Primary Examiner* — Sheikh Maruf
(74) *Attorney, Agent, or Firm* — Oblon, McClelland, Maier & Neustadt, L.L.P.

(57) ABSTRACT

Method for fabricating transistors for an integrated 3D circuit, comprising:
a) forming, on a given level of transistors made in a first semiconductor layer: a stack comprising a first region of a second semiconductor zone suitable for an N-type transistor channel and a second region of the second semiconductor zone suitable for a P-type transistor channel of a higher level, the stack moreover comprising a ground plane continuous layer (40), as well as an insulating layer between the ground plane and the second semiconductor layer, then
b) exposing source and drain zones of the circuit to a laser (L), so as to carry out at least one thermal activation annealing, where the exposed source and drain zones are located next to an upper surface of the ground plane continuous layer, where the ground plane continuous layer is configured so as to protect at least a part of the circuit located on the side of a lower face of the ground plane continuous layer from the laser, then
c) carrying out cutting up of the ground plane continuous layer (40) into at least one first portion and one second portion separated from the first portion, where the first
(Continued)

portion is configured to allow biasing of the first region, where the second portion is configured to allow biasing of the second region.

9 Claims, 19 Drawing Sheets

(51) Int. Cl.
| | |
|---|---|
| *H01L 21/8232* | (2006.01) |
| *H01L 21/822* | (2006.01) |
| *H01L 21/324* | (2006.01) |
| *H01L 21/268* | (2006.01) |
| *H01L 27/02* | (2006.01) |
| *H01L 21/306* | (2006.01) |
| *H01L 29/66* | (2006.01) |
| *H01L 21/762* | (2006.01) |
| *H01L 21/02* | (2006.01) |
| *H01L 21/3105* | (2006.01) |
| *H01L 21/8238* | (2006.01) |
| *H01L 21/027* | (2006.01) |
| *H01L 27/06* | (2006.01) |

(52) U.S. Cl.
CPC .. *H01L 21/30604* (2013.01); *H01L 21/31053* (2013.01); *H01L 21/324* (2013.01); *H01L 21/76224* (2013.01); *H01L 21/823814* (2013.01); *H01L 21/823828* (2013.01); *H01L 21/823878* (2013.01); *H01L 21/84* (2013.01); *H01L 27/0203* (2013.01); *H01L 29/66545* (2013.01); *H01L 21/0274* (2013.01); *H01L 21/823842* (2013.01); *H01L 21/823871* (2013.01); *H01L 27/0688* (2013.01)

(58) Field of Classification Search
USPC ... 438/154, 153, 143, 151, 71, 351, E29.117
See application file for complete search history.

(56) References Cited

U.S. PATENT DOCUMENTS

| | | | | |
|---|---|---|---|---|
| 5,459,090 | A * | 10/1995 | Yamazaki | H01L 27/1214 438/154 |
| 5,545,571 | A * | 8/1996 | Yamazaki | H01L 21/32105 205/106 |
| 5,650,338 | A * | 7/1997 | Yamazaki | H01L 27/1214 438/151 |
| 5,904,509 | A * | 5/1999 | Zhang | H01L 21/2652 438/154 |
| 6,162,688 | A * | 12/2000 | Gardner | H01L 21/266 257/E21.192 |
| 6,251,712 | B1 * | 6/2001 | Tanaka | H01L 29/66757 257/E21.413 |
| 6,649,980 | B2 * | 11/2003 | Noguchi | H01L 21/84 257/351 |
| 9,023,688 | B1 | 5/2015 | Or-Bach et al. | |
| 2002/0142571 | A1 * | 10/2002 | Noguchi | H01L 21/84 438/585 |
| 2005/0037603 | A1 | 2/2005 | Coronel et al. | |
| 2005/0082537 | A1 * | 4/2005 | Arao | H01L 27/1214 257/72 |
| 2013/0146953 | A1 | 6/2013 | Cheng et al. | |
| 2013/0241026 | A1 | 9/2013 | Or-Bach et al. | |
| 2013/0292767 | A1 * | 11/2013 | Yang | H01L 27/1211 257/347 |
| 2016/0204251 | A1 * | 7/2016 | Masuoka | H01L 21/823814 257/329 |
| 2016/0336421 | A1 * | 11/2016 | Cheng | H01L 27/0924 |

OTHER PUBLICATIONS

U.S. Appl. No. 14/890,016, filed Nov. 9, 2015, 2016/0279666 A1, Olivier Dellea, et al.
U.S. Appl. No. 14/890,857, filed Nov. 12, 2015, 2016/0101432 A1, Olivier Dellea, et al.
U.S. Appl. No. 14/950,416, filed Nov. 24, 2015, 2016/0149039 A1, Shay Reboh, et al.
U.S. Appl. No. 15/049,468, filed Feb. 22, 2016, 2016/0254362 A1, Sylvain Maitrejean, et al.
U.S. Appl. No. 15/184,076, filed Jun. 16, 2016, 2016/0372375 A1, Claire Fenouillet-Beranger, et al.
U.S. Appl. No. 15/335,092, filed Oct. 26, 2016, 2017/0117186 A1, Claire Fenouillet-Beranger, et al.
U.S. Appl. No. 15/365,378, filed Nov. 30, 2016, 2017 0162788 A1, Claire Fenouillet-Beranger, et al.
U.S. Appl. No. 15/816,328, filed Nov. 17, 2017, Claire Fenouillet-Beranger, et al.
French Preliminary Search Report dated Jul. 20, 2017 in French Application 16 61386 filed on Nov. 23, 2016 (with English Translation of Categories of Cited Documents).
O. Weber, et al., "Work-function Engineering in Gate First Technology for Multi-Vt Dual-Gate FDSOI CMOS on UTBOX," IEDM, 2010, 4 Pages.
L. Grenouillet, et al., "Ground Plane Optimization for 20nm FDSOI Transistors with Thin Buried Oxide," SOI Conference, 2012 IEEE International, 2012, 2 Pages.
Y-T. Liu, et al., "Thermal Accumulation Improvement for Fabrication Manufacturing of Monolithic 3D Integrated Circuits," Solid-State and Integrated-Circuit Technology, 2008, 4 Pages.

* cited by examiner

METHOD FOR FABRICATING AUTO-ALIGNED INTERCONNECTION ELEMENTS FOR A 3D INTEGRATED CIRCUIT

TECHNICAL FIELD AND PRIOR ART

The present application relates to the field of integrated circuits equipped with components distributed over several levels, in particular transistors. Such devices are generally referred to as three-dimensional or "3D" integrated circuits.

In general, in the field of integrated circuits an increase in the transistor density is continuously being sought.

To this end one solution involves distributing the transistors over several levels of superimposed semiconductor layers. Such circuits thus typically comprise at least two superimposed semiconductor layers separated from each other by an insulating layer.

The creation of the upper level stages can involve constraints in terms of the thermal budget. In certain cases it is sought, for example, to limit the thermal budget to 500° C. One of the reasons for this limitation is due to the inter-level interconnection elements. These elements are generally based on metals such as W and their electrical conduction properties may be affected when they are subjected to excessively high temperatures.

At the same time, some fabrication steps for this upper layer or layers such as, for example, the activation of dopants, sometimes results in high-temperature conditions. Laser annealing is one possible solution for performing such annealing without using too high a thermal budget. Nevertheless, a thermal diffusion phenomenon due to the laser may occur in the lower stage or stages of a 3D circuit during the course of manufacture.

The problem arises of finding a new method for a 3D integrated circuit that is improved in terms of the above mentioned drawbacks.

DESCRIPTION OF THE INVENTION

One embodiment of the present invention envisages a method for fabricating transistors for an integrated circuit equipped with several layers of superimposed transistors, which comprises:

a) forming, on a given level equipped with one or more transistors made at least partially in a first semiconductor layer: a stack comprising at least one first region of a second semiconductor layer suitable for receiving an N-type transistor channel and at least one second region of the second semiconductor layer suitable for receiving a P-type transistor channel of a level greater than the given level, where the stack moreover comprises a continuous layer made of conductive or doped semiconductor material and called the ground plane, as well as an insulating layer between the ground plane and the second semiconductor layer, then b) exposing one or more zones of the circuit to a laser, so as to carry out at least one thermal annealing, where the exposed zones are located on an upper surface of the ground plane continuous layer, where the ground plane continuous layer is configured so as to protect at least a part of the circuit located on the side of a lower face of the ground plane continuous layer from the laser, then c) cutting up of the ground plane continuous layer into at least one first portion and at least one second portion separated from the first portion, where the first portion is configured to allow biasing of the first region, where the second portion is configured to allow biasing of the second region.

The ground plane layer acts as a protective screen during the exposure to the laser and prevents too great a temperature rise in the level or levels lower than the given level.

Cutting up the ground plane layer into at least one first portion and at least one second portion allows independent and different biasings to be implemented. For example, the first portion may be envisaged for allowing the threshold voltage of N type transistors to the modulated, whilst the second portion may be configured to allow the threshold voltage of P type transistors to be modulated.

The fact that the ground plane layer is cut up after exposure to the layer preserves a continuous protective screen during this step over all the lower level or levels as well as providing improved protection of this or these lower layer or layers in order to allow their temperature rise to be further limited.

The exposure to the laser is undertaken in particular to carry out activation of dopants in the source and drain zones of the second semiconductor layer and/or semiconductor source and drain blocks formed on the second semiconductor layer. Thus activation of dopants of source and drain regions of the N type transistor and of the P type transistor of the upper level is achieved.

This activation by laser is implemented before cutting up of the ground plane continuous layer.

Advantageously the ground plane continuous layer is based on doped semiconductor, with the first portion being N doped, and the second portion being P doped.

The formation of the stack may comprise etching of the second semiconductor layer so as to form islands suitable for the creation of active zones of transistors. In this case, the ground plane layer is not etched, or remains more or less continuous at the end of this etching in order to cover the lower level or levels as well as possible, and to allow it to act as a screen.

According to one embodiment possibility, final gates can be formed for the transistors of the given level after cutting up of the ground plane layer.

In this case the method may advantageously comprise, prior to the cutting up of the ground plane continuous layer, the formation of a first sacrificial gate and of a second sacrificial gate and of a sacrificial linking element between the first sacrificial gate and the second sacrificial gate, then performing the cutting up of the ground plane continuous layer whilst forming a trench between the first sacrificial gate and the second sacrificial gate, where the trench crosses the sacrificial linking element and the ground plane continuous layer so as to separate the first portion and the second portion, filling the trench using at least one insulating material,
  removal of the sacrificial gates and replacing them with,
    respectively, a first replacement gate, a second replacement gate, and a connection element linking the first replacement gate and the second replacement gate.

According to one possibility for implementing the method, the filling of the trench comprises the deposition of a first insulating material which lines the trench and covers the first sacrificial gate and the second sacrificial gate then a layer of a second insulating material on the first insulating material, so as to obtain said filling and then, prior to the removal of the sacrificial gates:

planarization of the layer of second insulating material so as to remove the second insulating material facing the first sacrificial gate and the second sacrificial gate, formation of holes in the first insulation material layer, where the holes reveal the first sacrificial gate and the second sacrificial gate.

The trench may comprise a principal region of width $\Delta_2$ greater than the width L of the sacrificial gates and a narrowed region of width $\Delta_1 < \Delta_2$ of the sacrificial gates, where the narrowed region separates the first sacrificial gate and the second sacrificial gate.

According to one implementation possibility, final gates can be formed for the transistors of the given level and then cutting up of the ground plane layer performed.

According to one implementation possibility, the formation of the stack comprises the etching of the second semiconductor layer so as to form islands suitable for forming active zones of transistors, the method comprising the prior cutting up of the ground plane continuous layer:
  formation of a first sacrificial gate and a second sacrificial gate and a sacrificial linking element, where the islands and sacrificial gates are surrounded by a first encapsulation layer,
  removal of the sacrificial gates and their replacement with, respectively, a first replacement gate, a second replacement gate, and a connection element linking the first replacement gate and the second replacement gate, then
  removal of the first encapsulation layer and replacement with a second HSQ-based encapsulation layer, where the second encapsulation layer extends around the islands and beneath the connection element linking a gate 85b of a P type transistor and a gate 85a of an N type transistor,
  exposing a block of the second encapsulation layer which extends between the connection element and the ground plane layer using a laser or electron beam,
  removing this block so as to form a trench between the first replacement gate and the second replacement gate, where the trench passes through the connection element and the ground plane continuous layer,
  the cutting up of the ground plane continuous layer into at least one first portion and at least one second portion separated from the first portion, being carried out by etching in the extension of the trench.

With such a method the trench can be made beneath the connection element linking the first gate and the second replacement gate, without damaging this connection element.

Advantageously the exposure is carried out using a UV laser with short pulses between 40 ns and 160 ns. Within such a pulse duration range the protective function of the ground plane layer is improved.

BRIEF DESCRIPTION OF THE DRAWINGS

The present invention will be better understood on reading the description of example embodiments given, purely as an indication and in no sense restrictively, making reference to the appended illustrations in which.

Identical, similar or equivalent portions of the various figures have the same numerical references, to make it easier to pass from one figure to another.

In order to make the figures more readable, the various parts shown in the figures are not necessarily shown at a uniform scale.

Moreover, in the description hereafter terms which depend on the orientation of the structure, such as "on", "above", "under", underneath "lateral", "upper", "lower" etc. are applied assuming that the structure is oriented in the manner shown in the figures.

DETAILED DESCRIPTION OF PARTICULAR EMBODIMENTS

An example of a method for producing a three-dimensional or "3D" integrated circuit will now be given.

Figure 1:
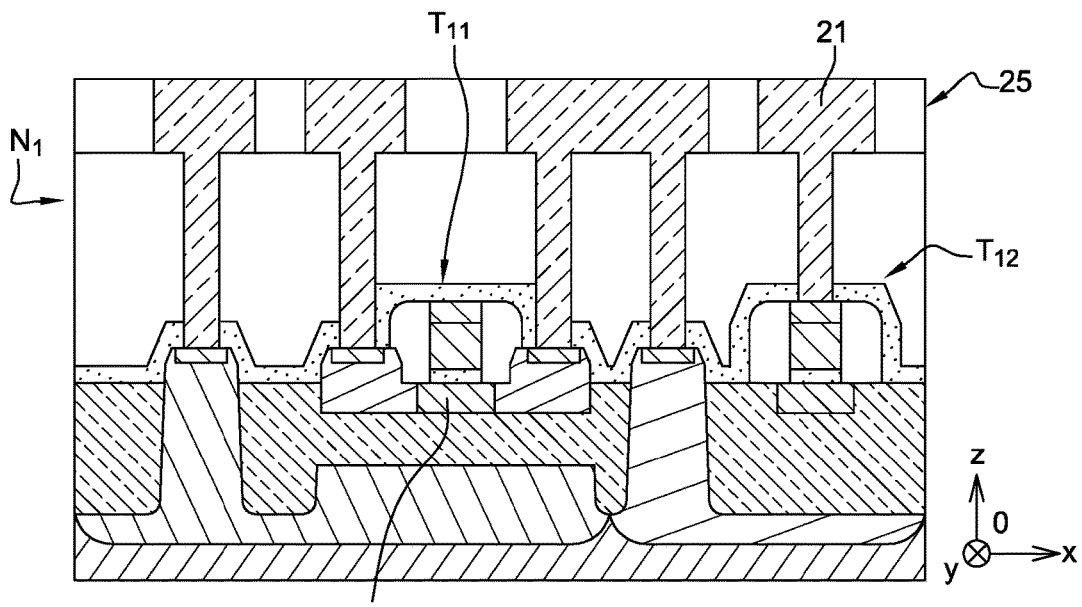
FIGS. 1, 2, 3A-3C, 4, 5, 6, 7, 8, 9, 10, 11A-11B, 12, 13, 14, 15, 16A-16C, 17A-17B show an example of a method for creating a 3D integrated circuit in accordance with one embodiment method of the present invention.

The circuit may be made from a substrate which comprises a first surface semiconductor layer 11 wherein one or more electronic components of a first level $N_1$ are envisaged. In the example shown in FIG. 1, the components are transistors $T_{11}$ and $T_{12}$, in particular of the MOS ("Metal Oxide Semiconductor") type and have respective channel regions which extend in the first semiconductor layer 11.

One or more connection conductive zones 21 belonging to the first level $N_1$ are also formed above the transistors $T_{11}$, $T_{12}$ and connected to them. The connection conductive zones 21 are typically made of metal, for example tungsten, and arranged in a layer 25 of dielectric-based material. This material may be of the type commonly called "low-k", in other words of low dielectric permittivity, such as for example SiOCH.

After having formed the first level $N_1$ of components, a stack of layers covering one or more of the connection zones 21 is made on this first level $N_1$.

Figure 2:
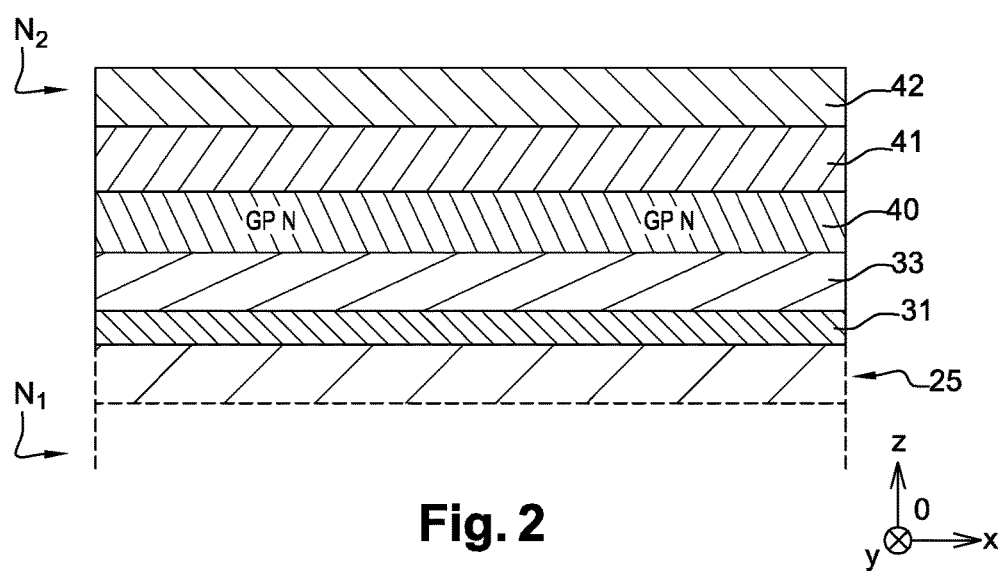

In FIG. 2 the insulating layer 25 wherein the connection zones of the first level $N_1$ are arranged is schematically shown using a contour made of a discontinuous line.

The stack made may also comprise a thin protective layer 31 provided so as to protect the connection zones of the first level $N_1$ during one or more subsequent etching step(s). The thin protective layer 31 may be formed, for example, of SiN.

On this thin protective layer 31, an insulating layer 33 is arranged and configured to form insulation between the first level $N_1$ and a second level $N_2$ of components. The insulating layer 33 is typically made of an insulating material which is different to that of the thin protective layer 31, for example of $SiO_2$.

The insulating layer 33 is covered with a so-called "ground plane" layer 40 intended to create a biasing beneath the transistors of a second level $N_2$ and to be able in particular to modulate the threshold voltages of transistors of the second level $N_2$ Such a ground plane layer 40 is provided in particular when the transistor or transistors of the second level $N_2$ are formed according to a "Fully Depleted Silicon on Insulator" SOI type technology, also known as FDSOI. The so-called "ground plane" layer 40 extends as a full plate and forms a continuous barrier between the first level $N_1$ and the second level $N_2$.

The ground plane layer 40 may be based on a semiconductor material that is doped or is intended to be doped.

Another insulating layer 41 is arranged on the ground plane layer 40, and separates the ground plane layer 40 from a second semiconductor layer 42. The insulating layer 41 separating the ground plane layer 40 is configured, in particular in terms of the material of which it is comprised and of thickness, so as to allow electrostatic coupling between the ground plane layer 40 and the second semiconductor layer 42. The insulating layer 41 is, for example, made of $SiO_2$ and has a thickness of between, for example, 5 nm and 20 nm. The insulating layer 41 may advantageously be a buried oxide ("BOX") layer of a semiconductor on insulator substrate whose second semi-conductor layer 42 is the surface layer.

In this embodiment example, one of more N type transistors and/or several P type transistors are envisaged in the second level $N_2$ of components. The channels of these transistors of the second level $N_2$ are intended to extend in the second semiconductor layer 42.

One method for forming this second semiconductor layer 42 may involve a transfer, for example in accordance with a molecular bonding technique, wherein a support comprising the second semiconductor layer 42 is transferred onto the insulating layer 41. This support may itself be equipped with an insulating layer, for example a silicon oxide-based ($SiO_2$) layer, which is therefore placed in contact with the insulating layer 41 in order to achieve an oxide-oxide type bond. According to one alternative, the second semiconductor layer 42 can be transferred directly onto the insulating layer 41 by molecular bonding.

In order to be able to independently create biasing of the N type transistors and P type transistors using the ground plane layer 40, it is envisaged that a first portion 40a of this layer 40 is reserved for rear-biasing of the N type transistors and that a second portion 40b of this ground plane conductive layer 40 be reserved for rear biasing of the P type transistors.

In the case of the ground plane layer 40 being semiconducting, the first portion 40a may advantageously be envisaged as being N doped and the second portion 40b being P doped.

Figure 3A:
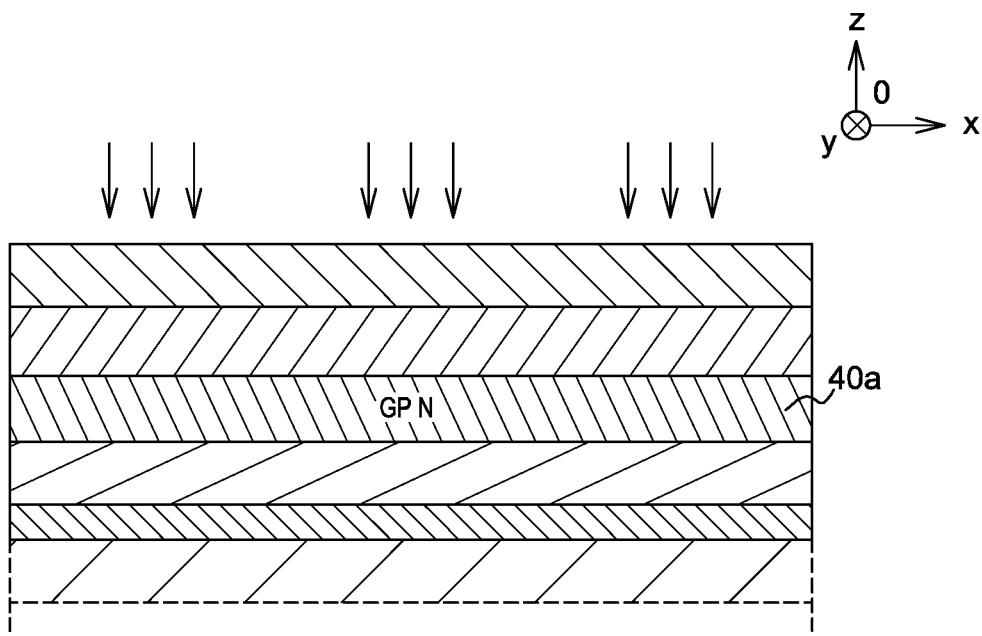
Figure 3B:
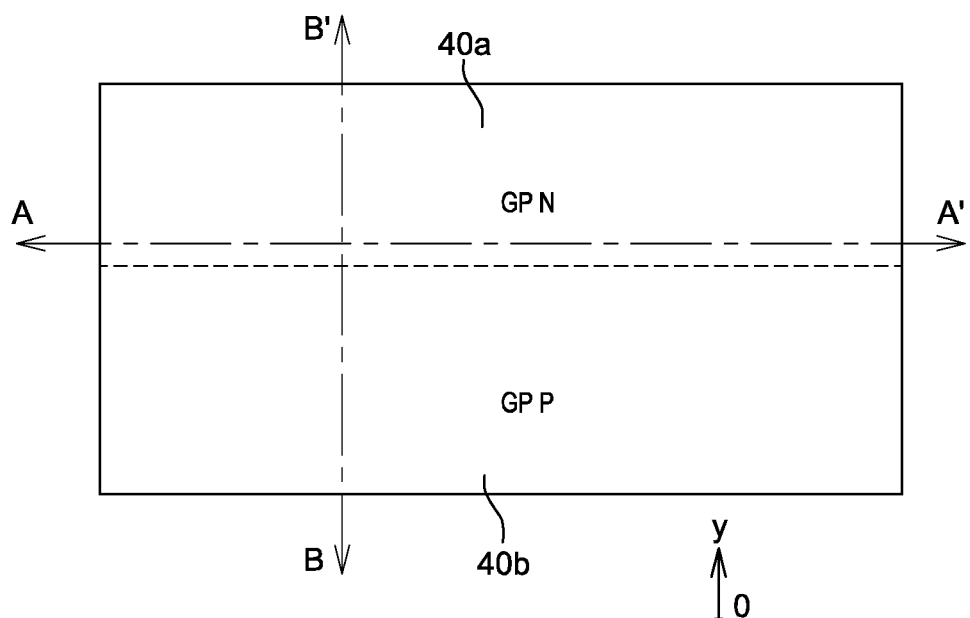
Figure 3C:
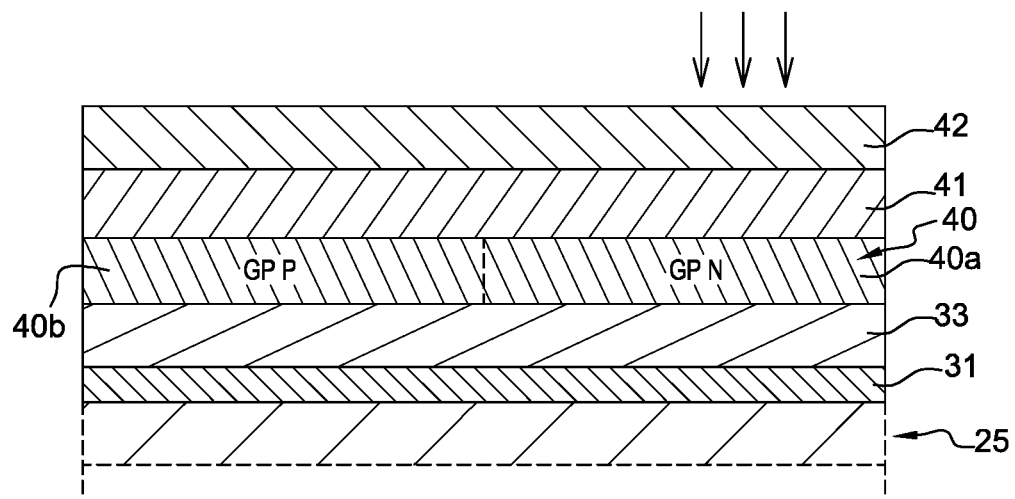

FIGS. 3A-3C show (by means of, respectively, a view along a first transverse section AA', a top view, a second transverse section view BB', where the cross-section plane AA' is parallel to the plane [O; x; z] of an orthogonal reference [O; x; y; z] indicated on each of the figures, where the section plane BB' is parallel to a plane [O; y; z]) a definition of the portion 40a doped using, for example, at least one ion implantation step. Similarly the portion 40b may be doped by implantation.

Figure 4:
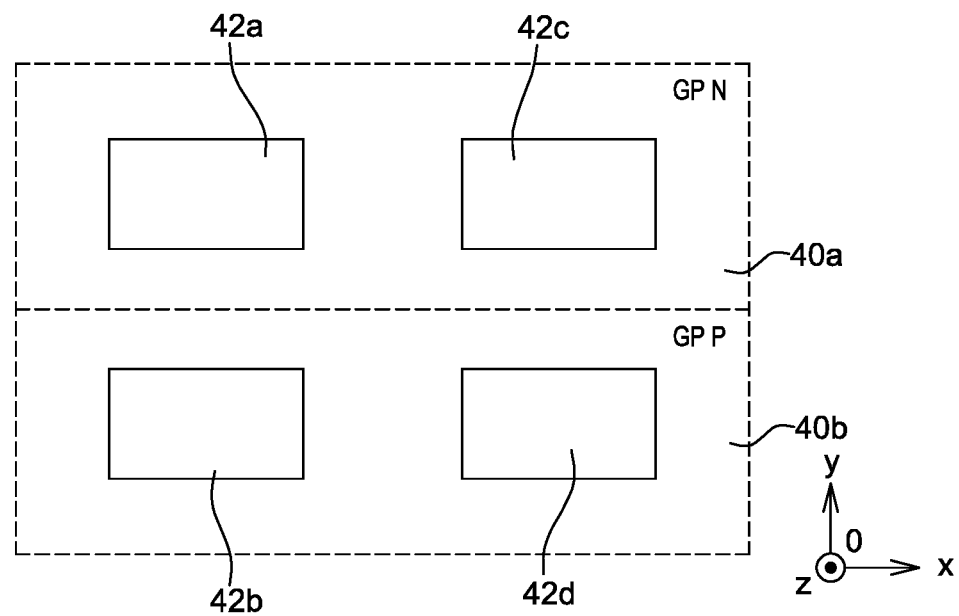
Figure 5:
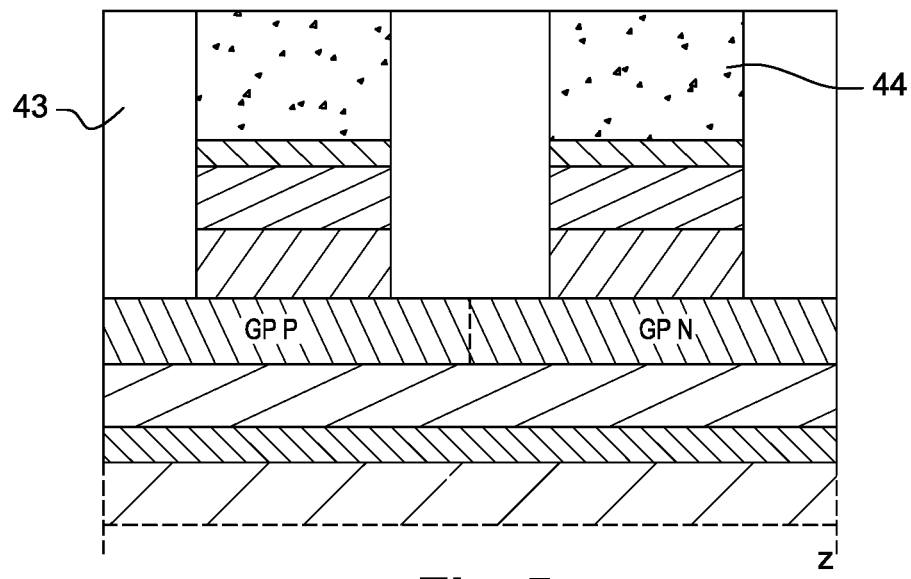

Then (top view of FIG. 4), the islands 42a, 42b, 42c, 42d are defined in the second semiconductor layer suitable for forming active transistor zones of the second level $N_2$. The islands 42a, 42b, 42c, 42d are made by etching of the second semiconductor layer 42, for example dry etching. This etching is extended into the insulating layer 41 and stops when it reaches the ground plane layer 40. The ground plane layer 40 is therefore not etched at this stage and remains continuous.

Then sacrificial gates are formed on the islands 42a, 42b, 42c, 42d, by the deposition of a material, such as polysilicon, which may be similar to that of the ground plane 40. A hard mask 46, for example made of SiN is then typically made.

Then steps using photolithography and then etching of portions not protected by the hard mask 46 are carried out. A gate dielectric such as, for example, $HfO_2$ may be deposited prior to the deposition of the sacrificial gate material 44.

After the sacrificial gate patterns are made, encapsulation which may be of the same type as the layers 41, 33, for example based on $SiO_2$, is formed around an insulating layer 43. A planarization or polishing step to remove a portion of the excess of the insulating layer 43 exceeding above the sacrificial gates is then carried out. At the end of this step the upper faces or tops of the sacrificial gates are revealed.

Figure 6:
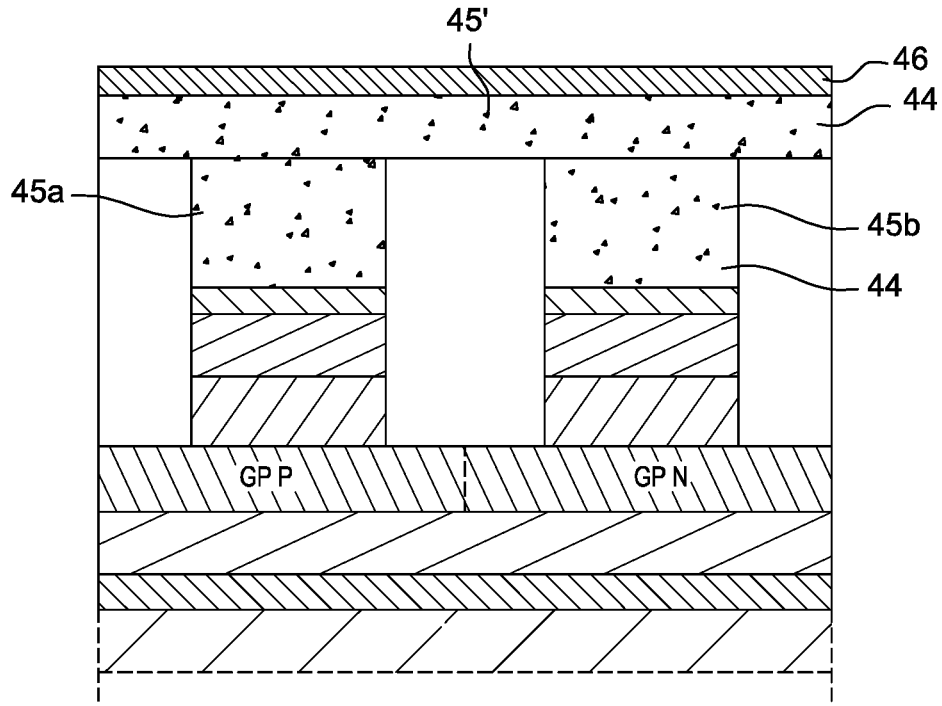

The formation of a link element 45' between a sacrificial gate 45a of an N type transistor and a sacrificial gate 45b of a P type transistor may be envisaged. This link element 45' is in this example formed by a continuous block facing the islands 42a and 42b with the same material 44 as the sacrificial gates 45a, 45b (FIG. 6 shows a transverse section view through BB').

Figure 7:
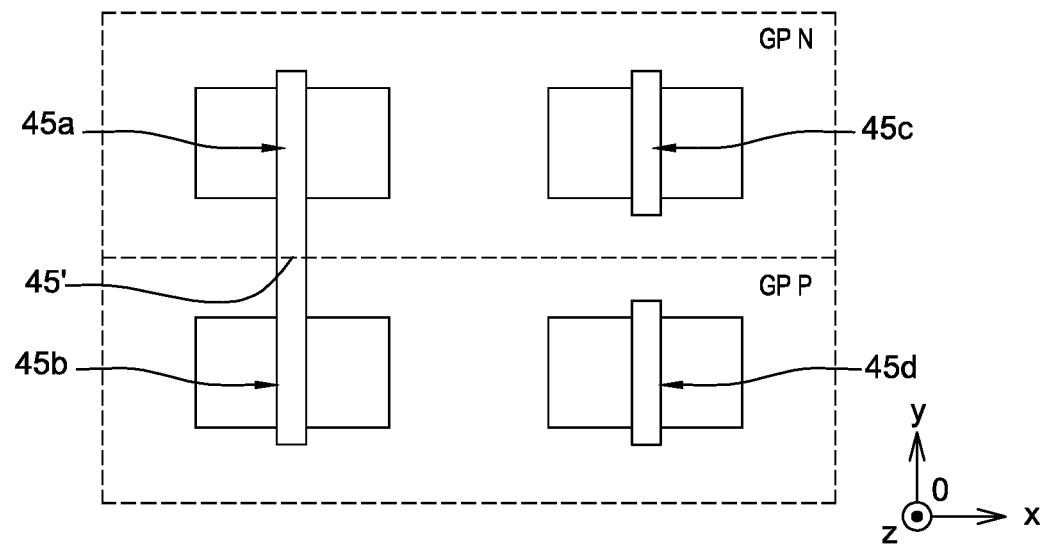

In the embodiment example shown in FIG. 7 (which shows a top view), other transistors of the second level are also provided with sacrificial gates 45c, 45d which are not linked together.

Insulating spacers 49 are then formed, for example made of silicon nitride, on either side of the sacrificial gates against the lateral flanks of the latter.

Figure 8:
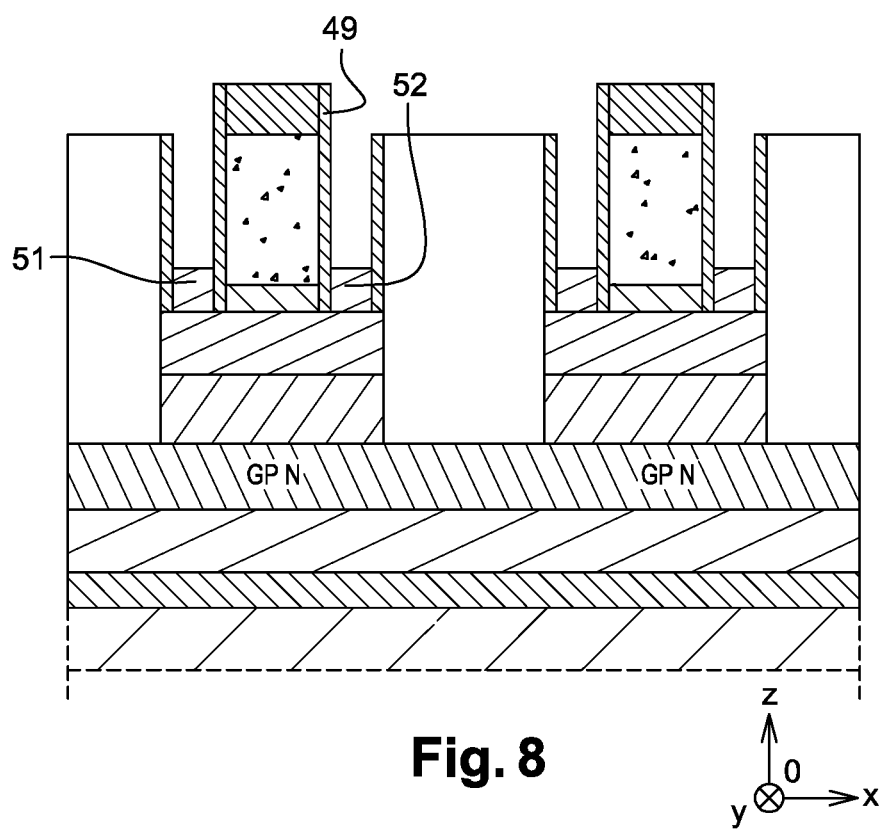

Then the source and drain semiconductor blocks 51, 52 are grown on either side of the sacrificial gates (FIG. 8 shows a transverse section view through AA'). The semiconductor blocks 51, 52 are typically made by epitaxy on the islands 42a, 42b, 42c, 42d coming from the second semiconductor layer 42. Doping of the source and drain blocks is carried out. This doping is performed, for example, in situ, i.e. during the growth of the semiconductor material. Alternatively the doping of source and drain blocks 51, 52 is implemented by implantation.

Figure 9:
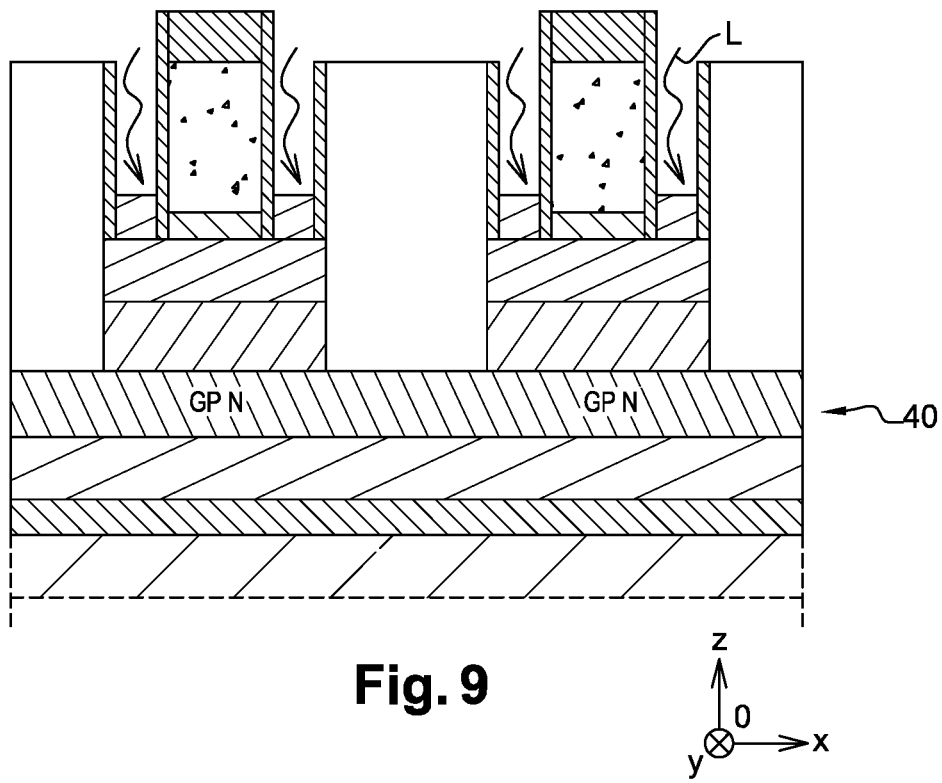

Then at least one activation annealing of the dopants of the junctions of second level $N_2$ is carried out. This annealing is here carried out using a laser L (FIG. 9 shows a transverse section view through AA'). A UV laser is typically used to conduct this annealing. In particular, a laser can be used which emits at a wavelength of 308 nm with a power of, for example, between 0.15 $J/cm^2$ and 0.3 $J/cm^2$ for a duration, for example, of between 40 ns and 160 ns. Such exposure conditions are implemented for isolating layers 41, 33 of silicon oxide of thickness 50 to 250 nm. A power is chosen such that it decreases as the total thickness of the oxide increases. These power and duration ranges also depend on the thickness of the layer of nitride which may, for example, be of the order of 30 nm.

During the activation annealing using the laser L, the ground plane layer 40, which is continuous and which extends such that it covers all of the level $N_1$ of components, acts as protection for the first level $N_1$ and prevents diffusion of heat from its lower face side, in other words in the first level $N_1$. The fact that the ground plane layer 40 has been kept continuous without up to now etching it, or at least such that it comprises no discontinuity, means that the entire level $N_1$ of components can be protected and the temperature increase of the first level $N_1$ can be limited. Thus damage to the metal connections 21 and unwanted diffusion or deactivation of dopants of the junctions of the first level N1 can be avoided, together with any degradation of the metal alloy and semiconductor zones of the first level $N_1$ formed, for example using a silicide-based material, in order to make contacts. In order to limit the effect of heat diffusion into the lower level, the thickness of the insulating layers 33 and 41 can also be altered in order to increase the laser reflection.

Figure 10:
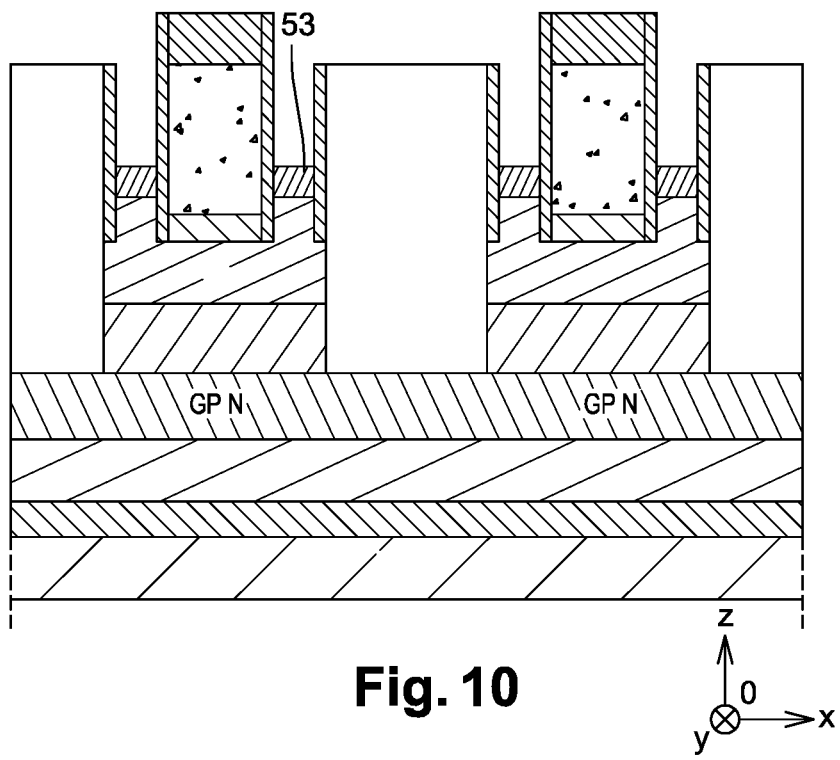

Metal alloy and semiconductor zones 53 can then be formed on the source 51 and drain 52 semiconductor zones. For this a metallic material is deposited such as Ni or Pt or Co or Ti, then thermal annealing is carried out in order to form a silicide when semiconductor regions 51 and 52 are made of silicon (FIG. 10 gives a transverse section view through section AA').

Figure 11A:
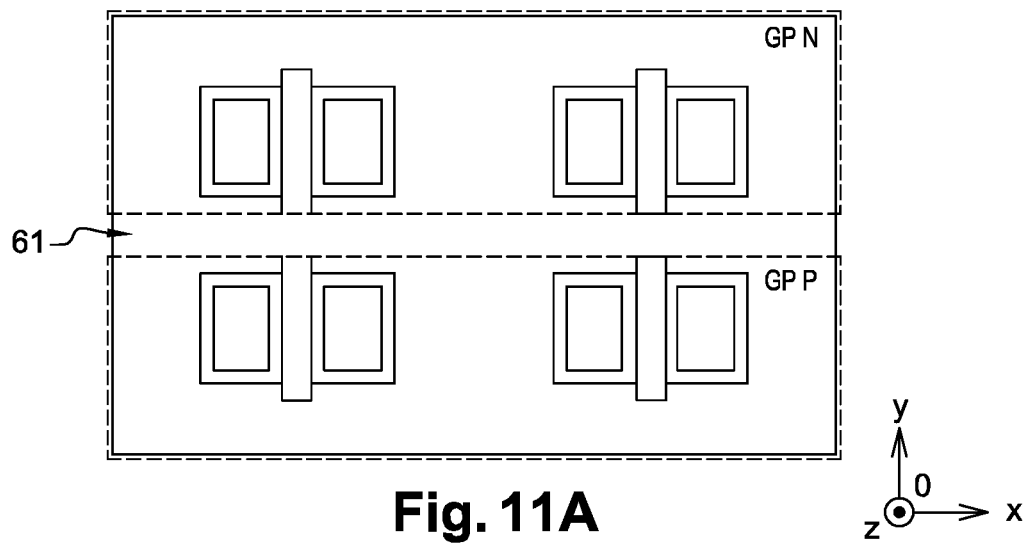
Figure 11B:
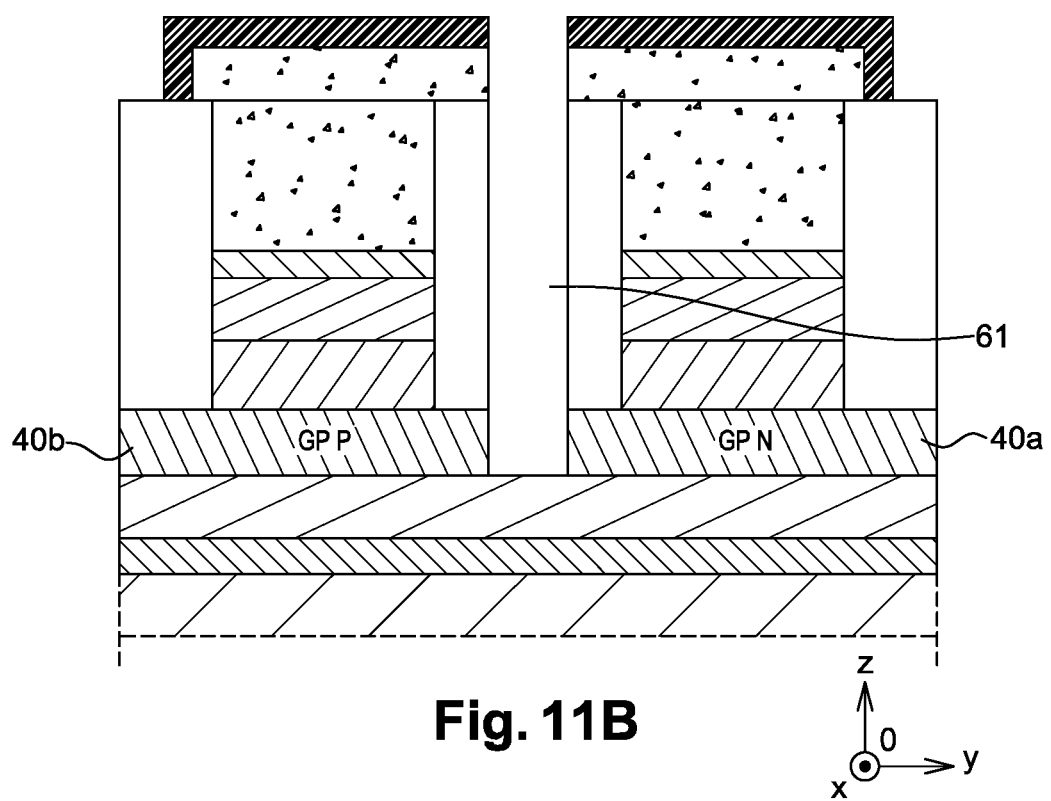

The ground plane continuous layer 40 is then cut up into several portions. In the embodiment example shown in FIGS. 11A and 11B (showing respectively a top view and a transverse section view through BB') a separation is formed between the first portion 40A which is N doped and the second portion 40b which is P doped. The cutting up is here carried out by forming at least one trench 61 between the sacrificial gates 45a, 45b. The trench 61 is thus formed through the sacrificial link element 45', the encapsulation layer 43, the ground plane layer 40. Such a trench 61 may for example be made by selective etching using $CH_3F$ with end-of etching detection on the polysilicon when the ground plane layer 40 is made of polysilicon. Selective etching of the ground plane 40 using HBr or HCl may subsequently be performed. Another etching method example envisages making the trench in the layer 43 by etching with $C_4F_8$ when the latter is made of oxide then carrying out etching of the ground plane layer 40 with $SF_6$.

In order to be able to subsequently carry out replacement of the sacrificial material 44 of the sacrificial gates by another gate material, a mask is formed a part of which fills the trench 61.

Figure 12:
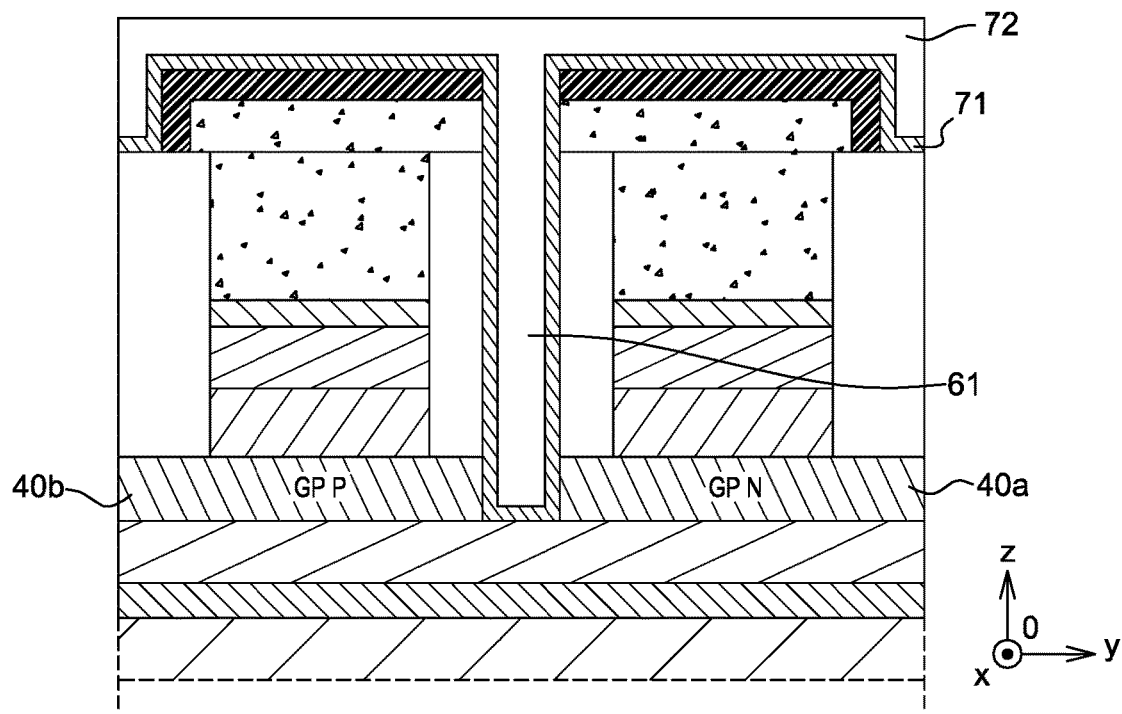

In the embodiment example shown in FIG. 12 (transverse section view along axis BB'), the mask is formed by the deposition of a first insulating material 71. The deposit is typically a conforming deposit made so as to line the walls and the bottom of the trench 61 and cover the sacrificial gates. Then a second insulating material 72 is made so as to cover the insulating material 71 and fill in the trench 61. The first insulating material 71 is advantageously selected so as to be able to be selectively etched relative to the first insulating material. For example, the first insulating material 71 is made of silicon nitride whereas the insulating material 72 is made of silicon oxide.

Figure 13:
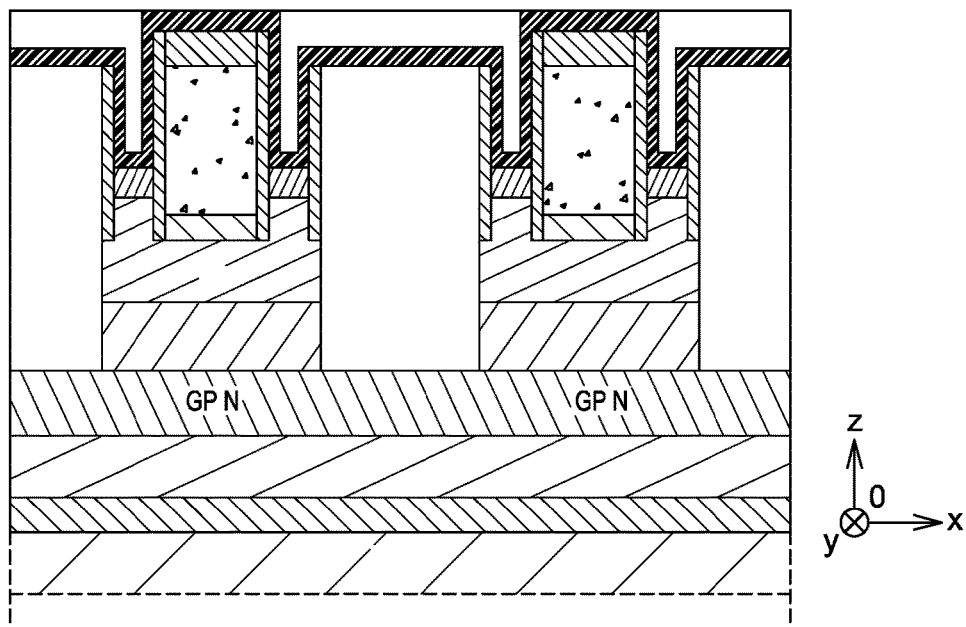

Planarization known also as CMP ("Chemical Mechanical Planarization") polishing is subsequently performed in order to reveal the first insulating material 71 zones covering the sacrificial gates (FIG. 13 shows a view along the transverse section AA').

Figure 14:
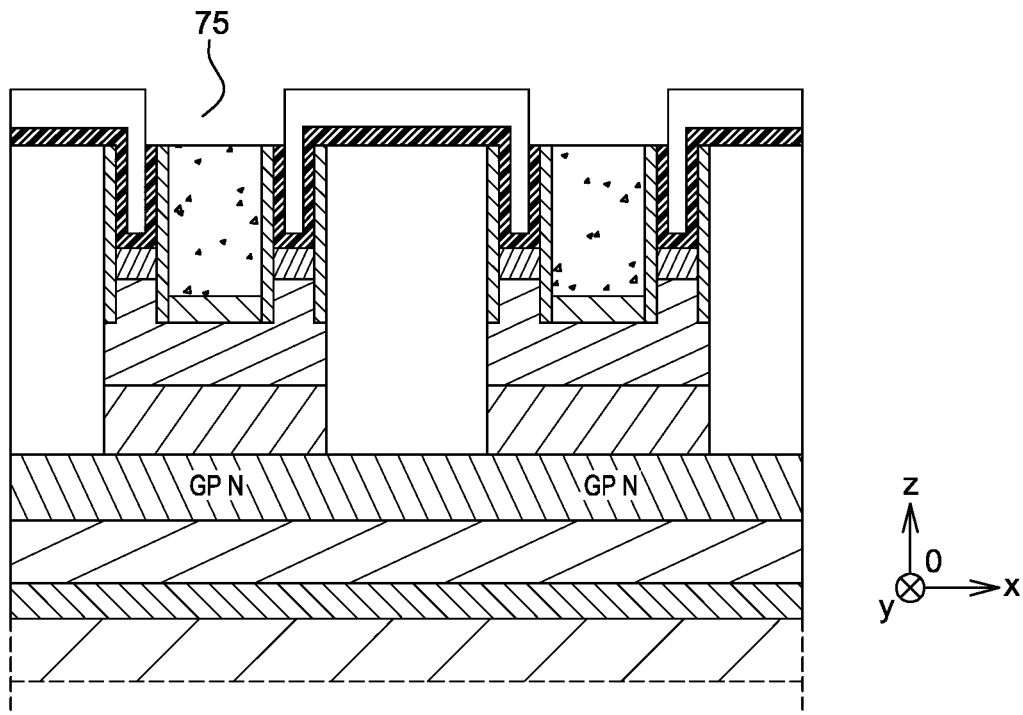

Then holes 75 are formed which reveal the sacrificial gates by means, for example, of photolithography, using a mask then by carrying out etching of the second insulating material 72 then of the first insulating material 71 (FIG. 14 shows a view along transverse section AA'). The sacrificial material 44 is then removed. In the case where the sacrificial material 44 is polySi based this removal can be achieved, for example, using isotropic etching, for example based on $SF_6$ or HCl.

Figure 15:
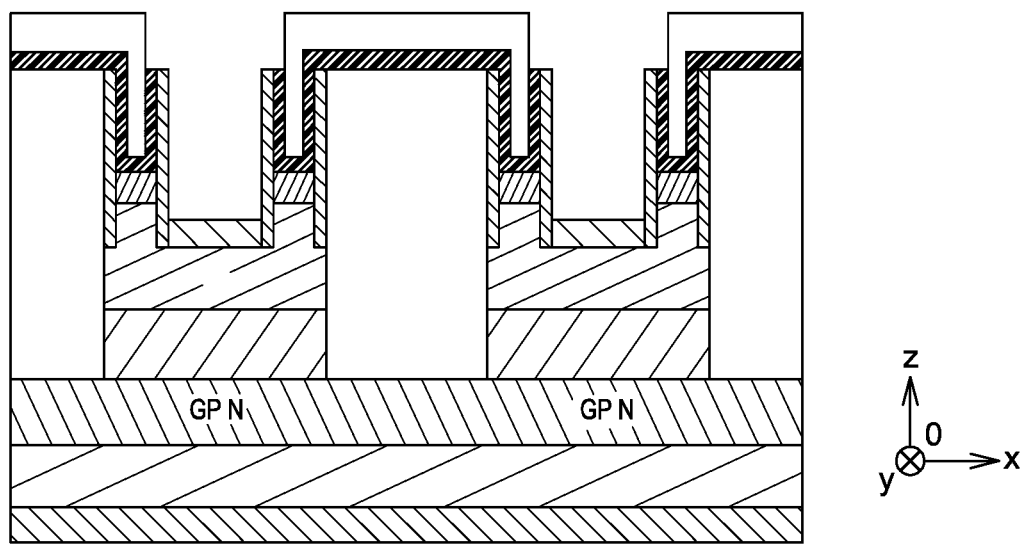

The insulating mask 71-72 protects the stack from this etching (FIG. 15 shows a view along the transverse section AA').

Figure 16A:
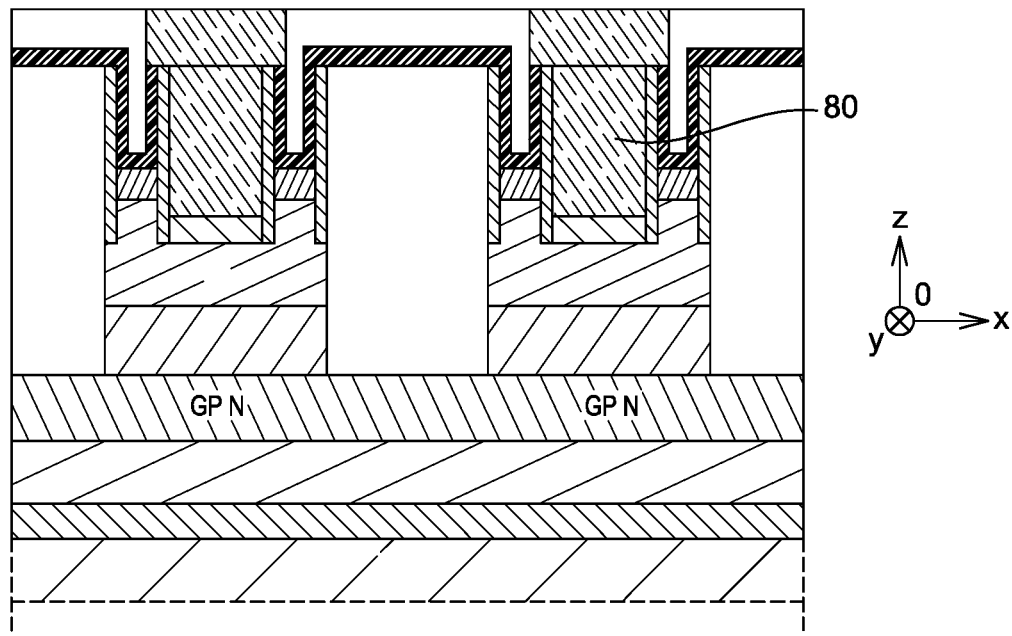
Figure 16B:
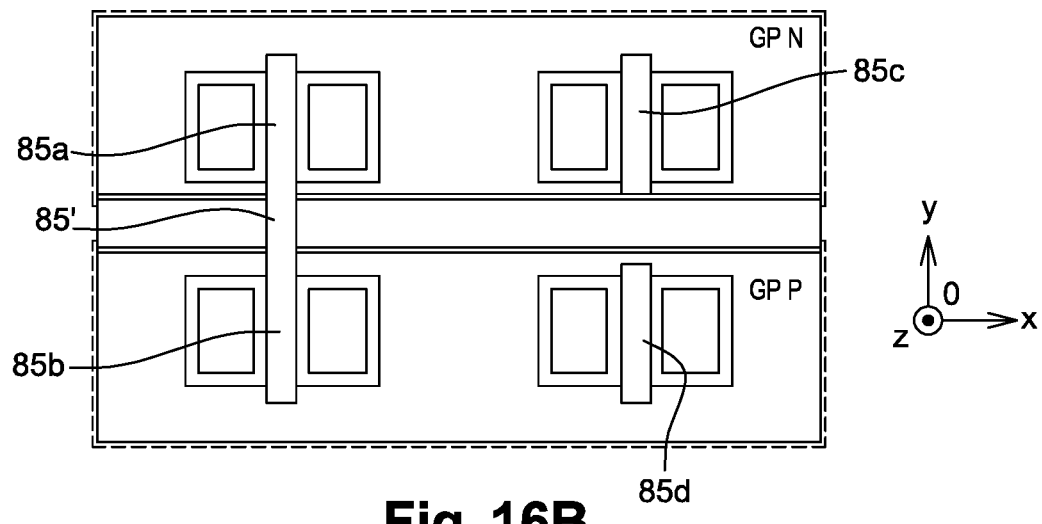
Figure 16C:
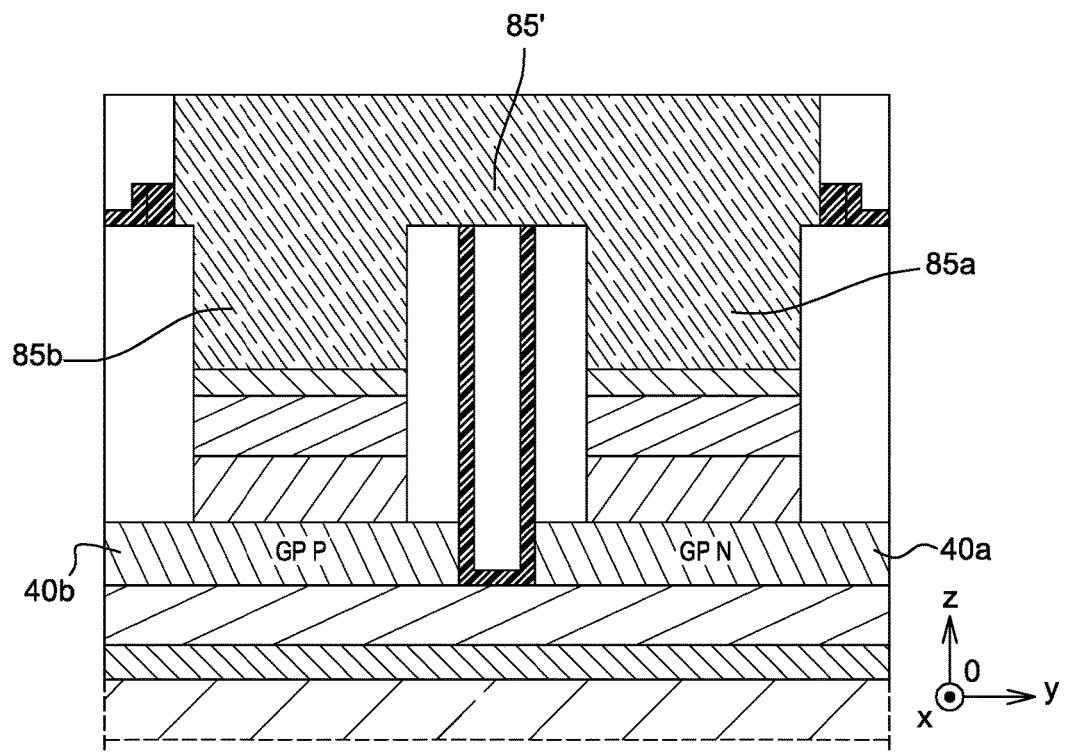

The sacrificial material 44 is then replaced by a conductive material 80, for example by a metallic material such as TiN/W, or W, in order to form replacement gates 85a, 85b, 85c, 85d (FIGS. 16A, 16B, 16C respectively show a section view along the axis AA', a top view and a section view along the axis BB'). The filling of the conductive material 80 can be achieved by filling the holes 75.

In the embodiment example in FIGS. 16B-16C, a replacement gate 85a of an N type transistor and a replacement gate 85b of a P type transistor are linked by an element 85' formed during the deposition of conductive material 80 whereas other N and P type transistors which are juxtaposed have independent gates 85c, 85d. The replacement gates comprise upper parts which are wider in form and which correspond to the holes 75 filled with conductive material 80.

Figure 17A:
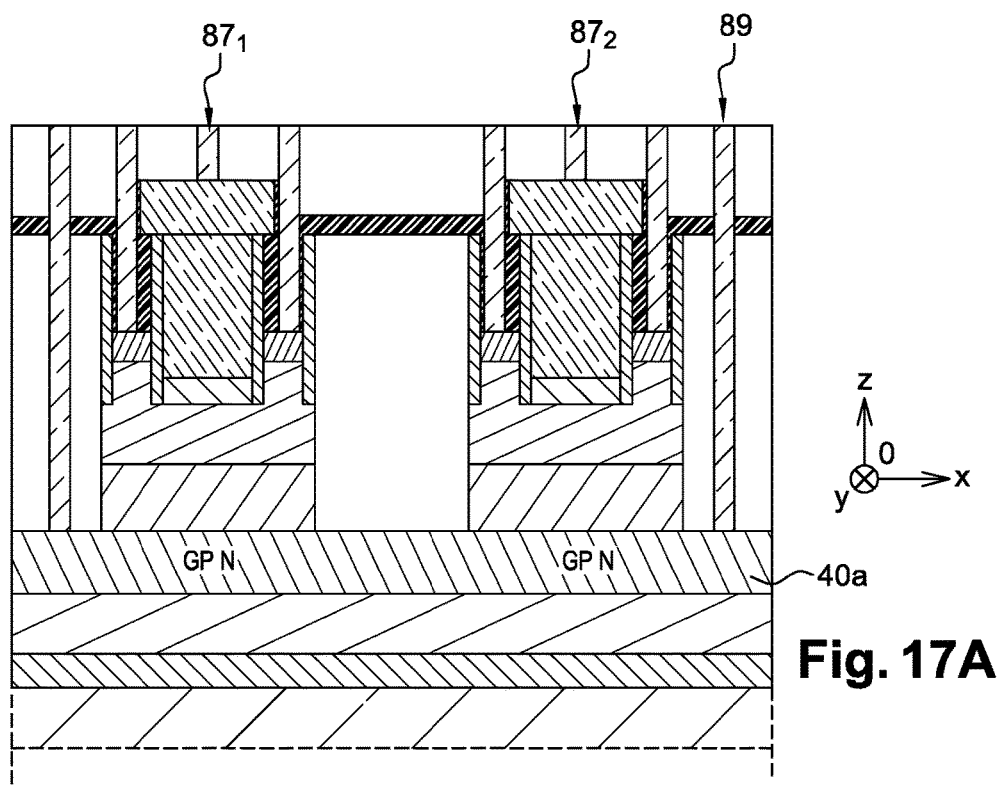
Figure 17B:
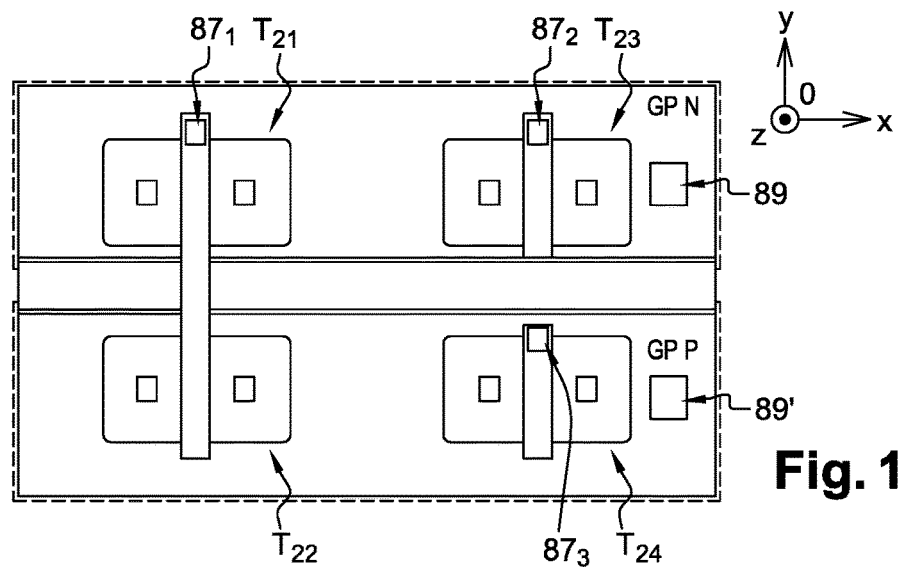
Figure 18:
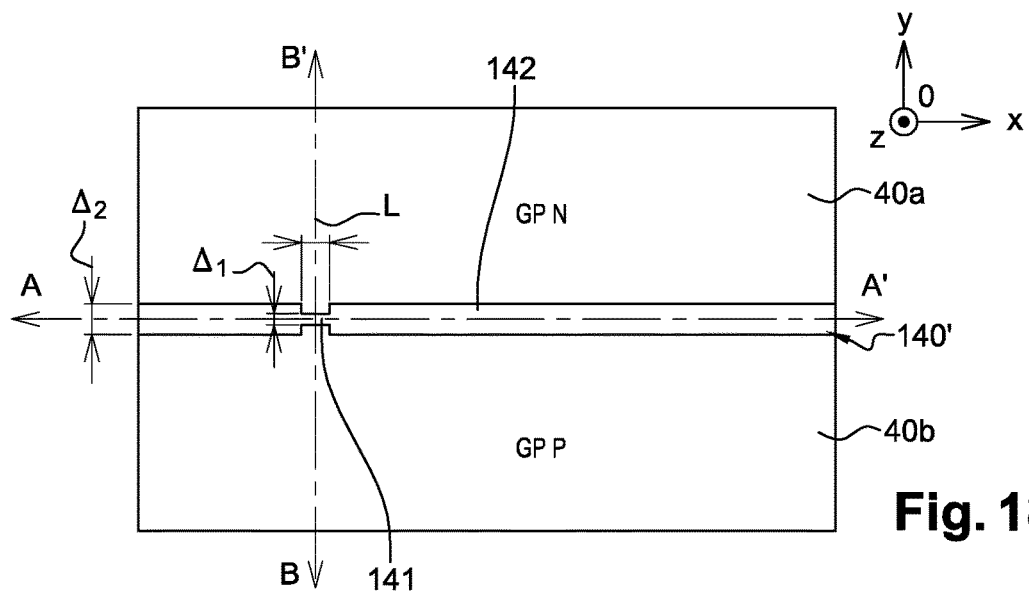
FIGS. 18, 19A-19B, 20, 21, 22A-22C show an alternative method for making an integrated 3D circuit.
Figure 19A:
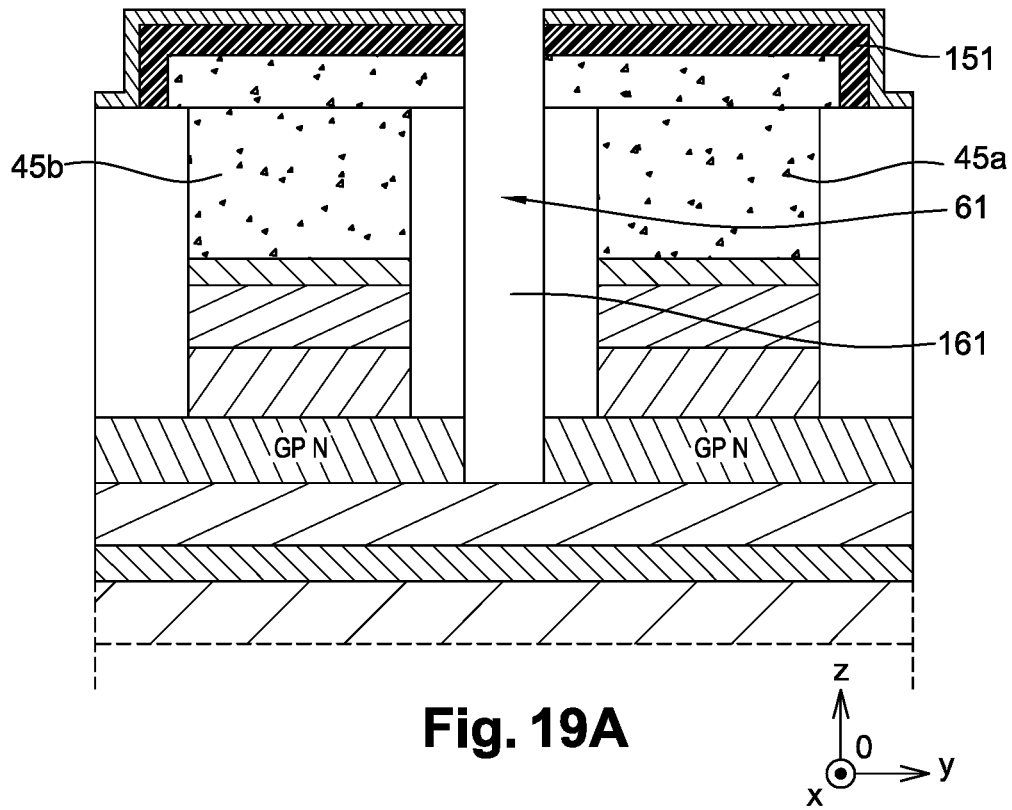
Figure 19B:
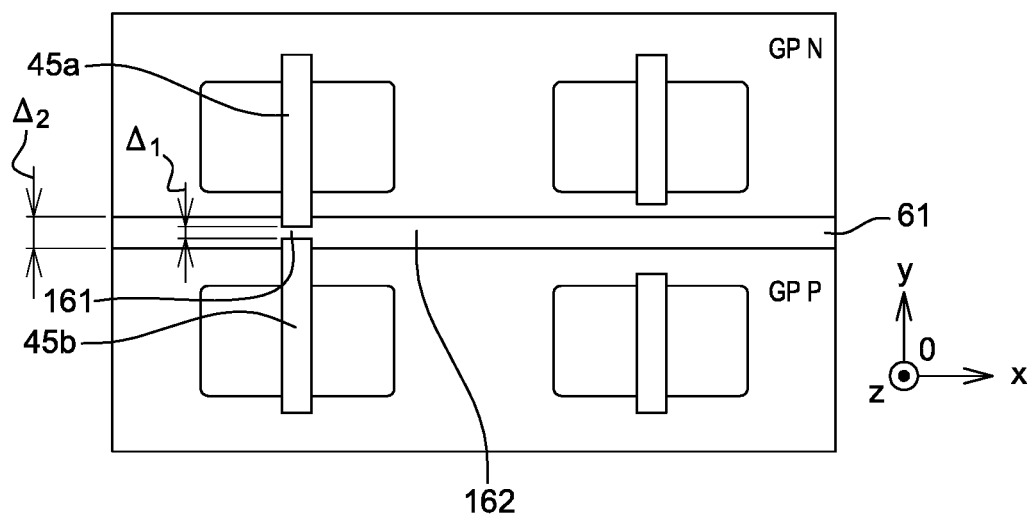

Thus contacts $87_1$, $87_2$, $87_3$, 89, 89' are formed (FIGS. 17A, 17B show respectively a section view along axis AA' and a top view).

Some contacts 89, 89' are respectively connected to the first ground plane portion 40a and to the second ground plane portion 40b disconnected from the first portion 40a. The contacts 89, 89' associated with the ground plane portions 40a, 40b allow the implementation of biasing which is independent, between on the one hand N type transistors $T_{21}$, $T_{23}$ and on the other hand P type transistors $T_{22}$, $T_{24}$.

Of the contacts $87_1$, $87_2$, $87_3$ made, one contact $87_1$ is connected to the gates 85a, 85b which are linked together. Other distinct contacts $87_2$, $87_3$ are connected respectively to a gate 85c and another gate 85d, where gates 85c, 85d are independent.

An alternative embodiment example envisages a different way of making the gates 85a, 85b and an approach which reduces the number of photolithography steps for making these gates. In particular a single photolithography step can be performed to form the gates instead of the two steps in the preceding example described. This reduces the risk of misalignment. Such misalignment could, in certain cases, possibly result in contacts unexpectedly making an unwanted contact with the gate.

In comparison with the method that has just been described, this alternative shown in FIGS. 18, 19A-19B, 20, 21, 22A-22C may allow a second gate photolithography step as described above in connection with FIG. 14 to be avoided.

First of all a separation zone 140' is made between first ground plane portion 40a and the second ground plane portion 40b with a particular arrangement, in particular in order to limit the risks of unexpected connection between on the one hand the gates 85a, 85b which are linked together of transistors $T_{21}$ and $T_{22}$ and on the other hand the source and drain contacts.

This separation zone 140' may be a non-doped zone of the ground plane layer and may be in the form of a strip located between the N type doped portion 40a and the P type doped portion 40b. The separation zone 140' comprises a region 141 narrowed in comparison with a principal region 142. The narrowed region 141 and the principal region 142 have different respective widths $\Delta_1$ and $\Delta_2$ (measured in a direction parallel to the vector y of the orthogonal reference [O; x; y; z] given in FIG. 18).

The width $\Delta_1$ is preferably less than the critical dimension L or gate width L envisaged for the transistors $T_{21}$ and $T_{22}$. The width $\Delta_2$ is greater than the critical dimension L or gate width L envisaged for the transistors $T_{21}$ and $T_{22}$, and preferably chosen such that $\Delta_2 > L + \delta$ where $\delta$ is a determined safety separation. This separation may be, for example, of the order of 5 nm. The narrowed region 141 furthermore extends over a length (measured in a direction parallel to the vector x) which is substantially equal to L (i.e. the critical dimension or gate length).

Subsequently, steps are carried out as described above in association with FIGS. 4 to 10, and in particular of cutting out islands forming active zones of transistors, of creating sacrificial gates, of formation of doped source and drain regions.

Then activation annealing using a laser is performed. As in the previous example, the un-etched ground plane continuous layer 40 is used as a means of protection used to limit the temperature rise of the lower level $N_1$ during the laser treatment.

Deposition of protective insulating material 151 is then performed, for example silicon nitride.

Then the trench 61 is formed to separate the portions 40a, 40b of the ground plane. The trench 61 made this time has a particular arrangement which follows the same design as that of the zone 140' described previously in association with FIG. 18. The trench 61 thus comprises in this example a region 161 of width $\Delta_1$ narrowed in comparison with a wider region $\Delta_2$ (FIGS. 19A-19B respectively show a section view along the axis AA' and a top view).

The narrowed part 161 of the trench 61 corresponds to a space formed between the sacrificial gates 45a, 45b during the fabrication of the trench 61.

Figure 20:
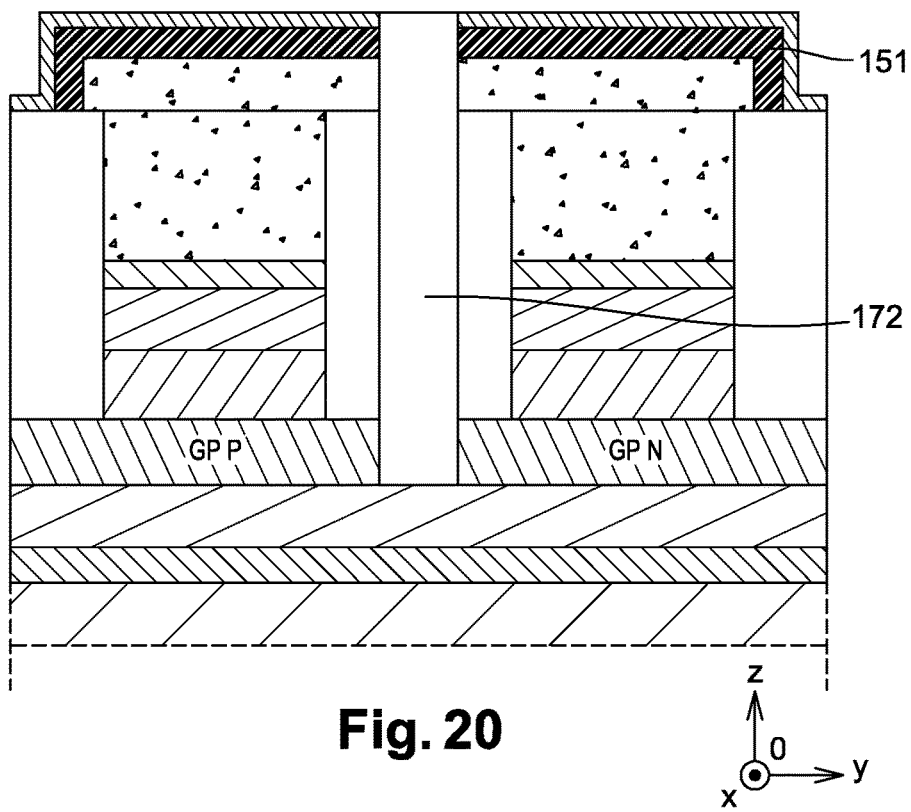

An insulating material 172 such as for example $SiO_2$ is then deposited allowing the trench 61 to be filled (FIG. 20 respectively shows a section view along the axis BB').

Then CMP planarization is performed so as to remove a zone of insulating material 151 and to reveal the sacrificial gates 45a, 45b.

The $SiO_2$ is then etched to obtain continuity between the 2 final gates, and then the sacrificial gates are removed.

Figure 21:
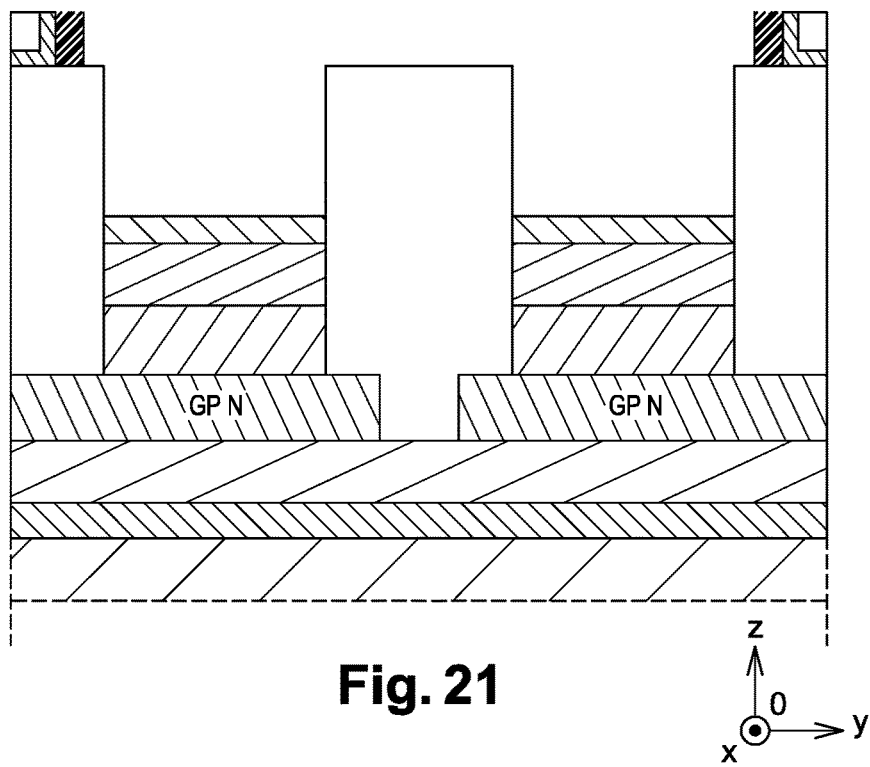

Then the sacrificial gates 45a, 45b are removed (FIG. 21 shows a section view along the axis BB').

Figure 22A:
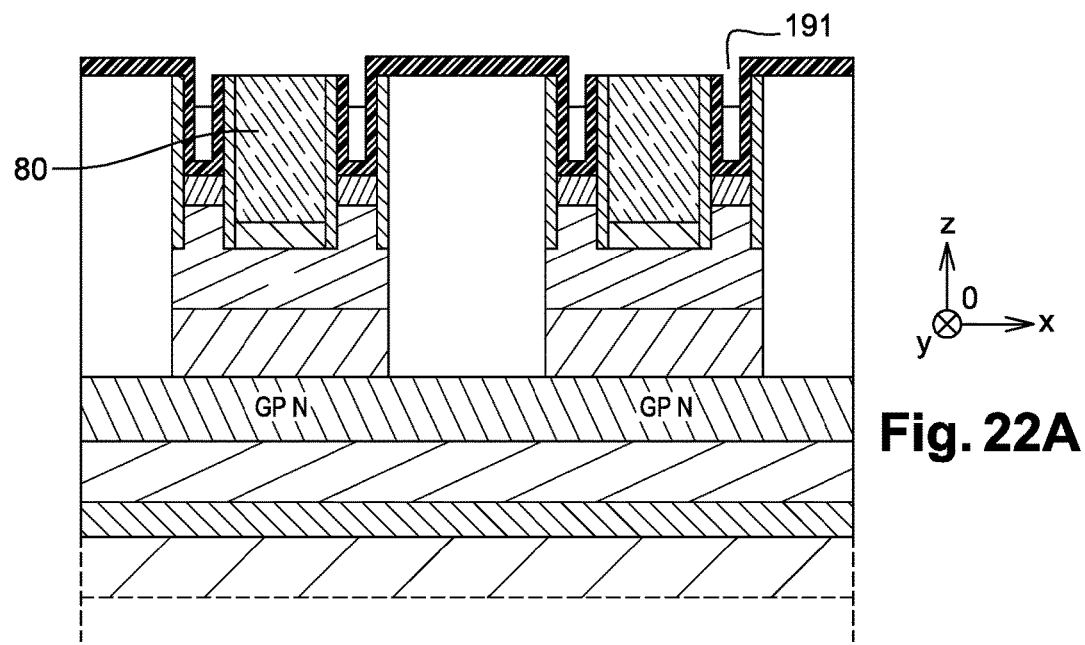
Figure 22B:
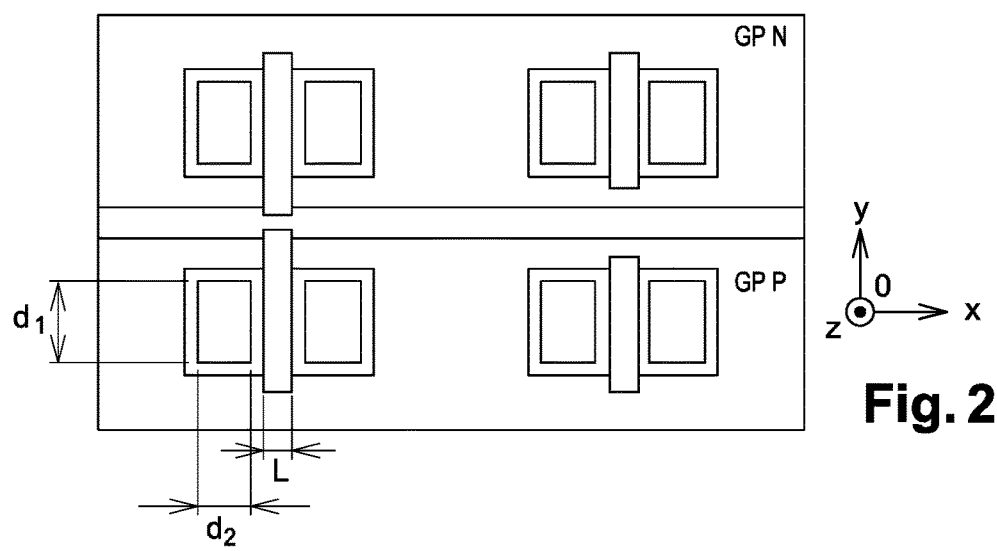
Figure 22C:
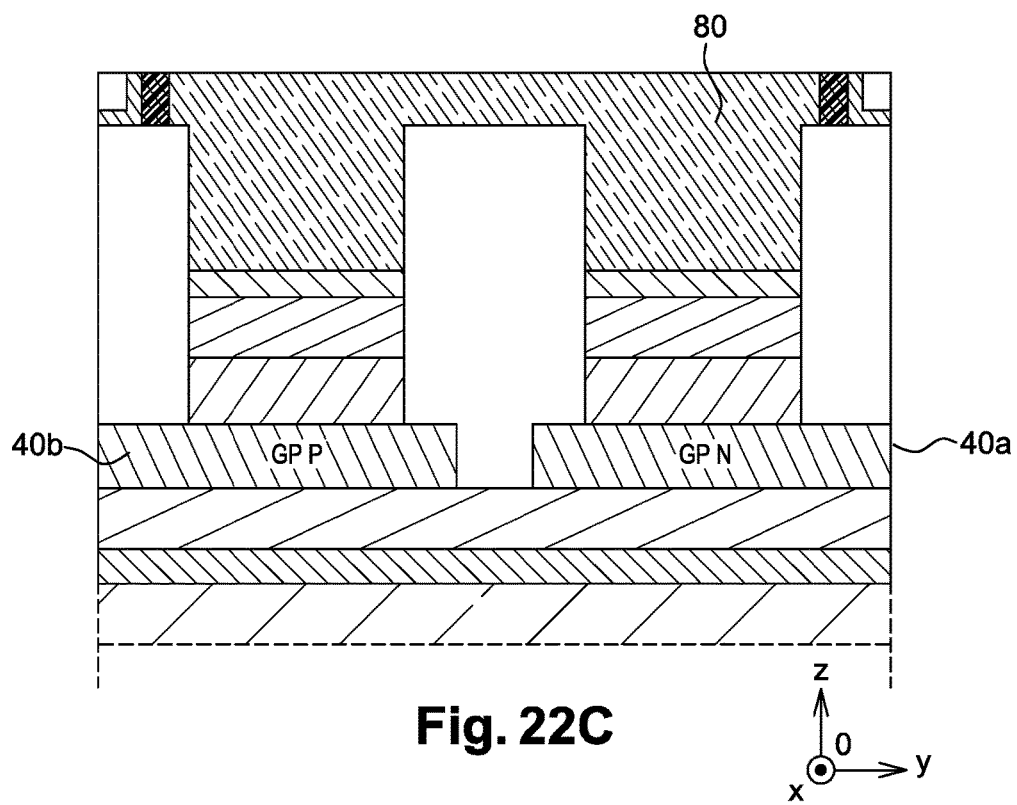

Etching of the sacrificial gates 45a, 45b leaves holes instead, which are subsequently filled with a conductive material 80 in order to form replacement gates 85a, 85b, 85c, 85d (FIGS. 22A, 22B, 22C respectively show a section view along the axis AA', a top view and a section view along the axis BB').

In order not to retain conductive material 80 in the regions located facing the islands and located on either side of the spacers, specific design rules may be envisaged. The width $d_2$ of the semiconductor islands and a distance $d_1$ between an edge of an island parallel to a lateral flank of the gate and this same lateral flank may be envisaged as being dependant on the width L of the replacement gate, such that: $d_1 > L + \delta$ and $d_2 > L + \delta$.

According to another example of a method according to the invention, the separation of the portions 40a, 40b of the ground plane is performed after forming the replacement gates.

For this other example, first of all steps are carried out such as described above in association with FIGS. 1 to 10 and in particular the formation of a stack comprising the ground plane layer and the second semiconductor layer and insulating layers one of which insulating layers is inserted between the ground plane layer and the second semiconductor layer. The cutting-out of the islands is then carried out in order to define the active regions of the transistors, to create sacrificial gates, to form doped source and drain regions.

Then, activation annealing using a laser is performed. As in the previous examples, during this annealing the unetched ground plane continuous layer 40 is used as a means of protection used to limit the temperature rise of the lower level $N_1$ during the laser treatment used to carry out the thermal annealing.

Silicidation of the source and drain regions can subsequently be performed.

Figure 23:
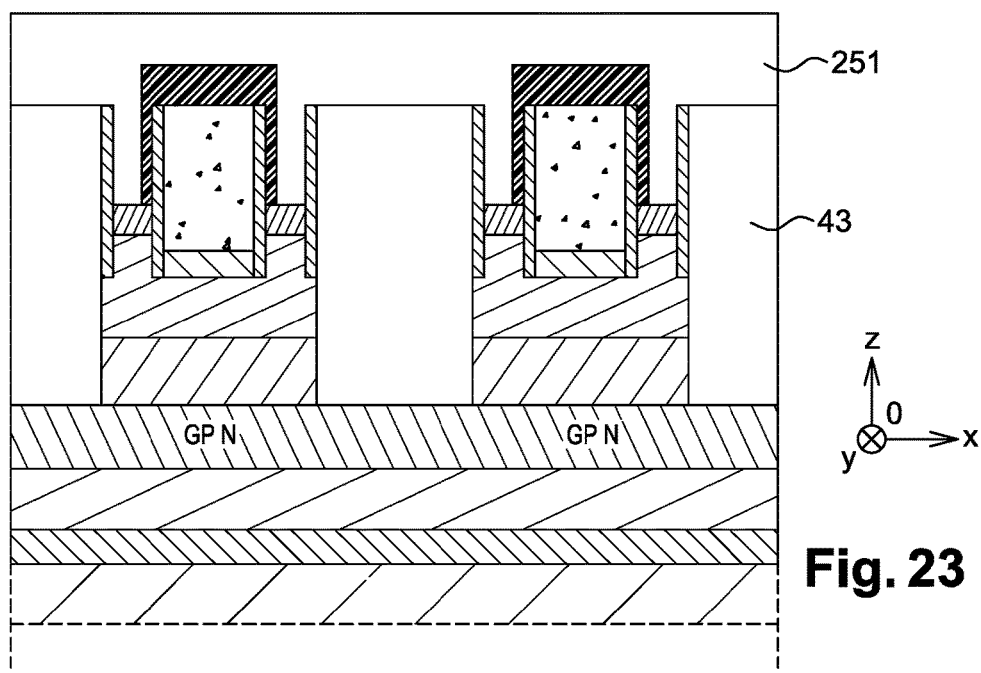
FIGS. 23, 24, 25, 26, 27, 28A-28B show another alternative method for making a 3D integrated circuit.

Then an insulating mask is formed by deposition of a layer of insulating material 251, for example of silicon oxide (FIG. 23 shows a section view along axis AA'). Then CMP planarization is performed so as to remove a thickness of this layer of insulating material 251 and to reveal the hard mask layer 46 covering the sacrificial gates 45a, 45b. Then holes 75 are made revealing the sacrificial gates.

Figure 24:
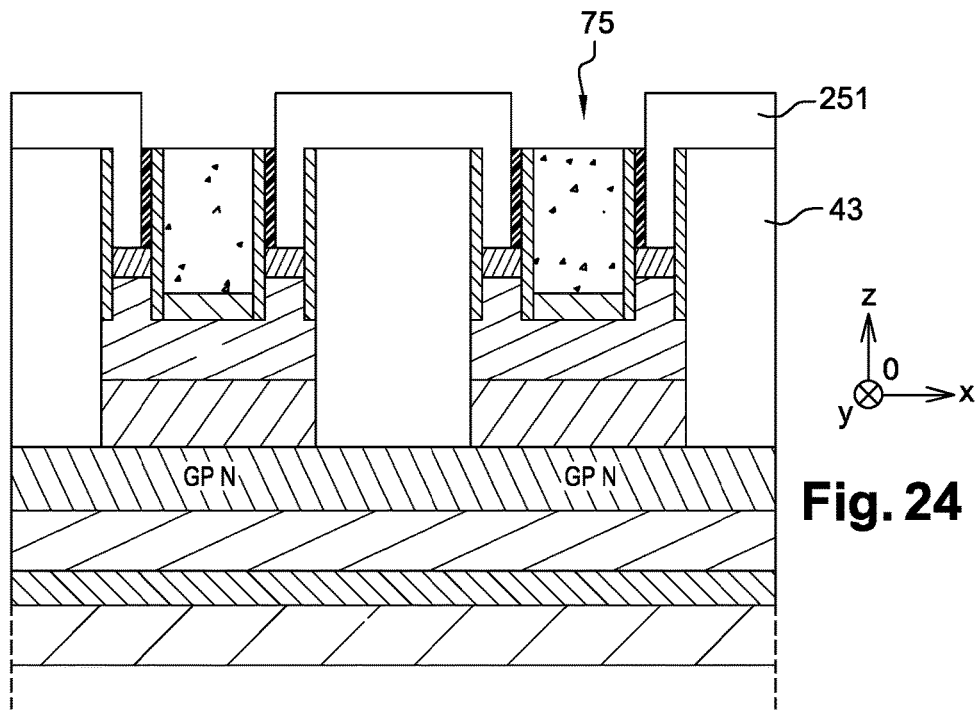

Then etching of the sacrificial gate material 44 is carried out (FIG. 24 shows a section view along axis AA'). The sacrificial material 44 is then removed.

In the case where the sacrificial material 44 is polySi based, this removal can be achieved, for example, using isotropic etching, for example based on $SF_6$ or HCl.

Figure 25:
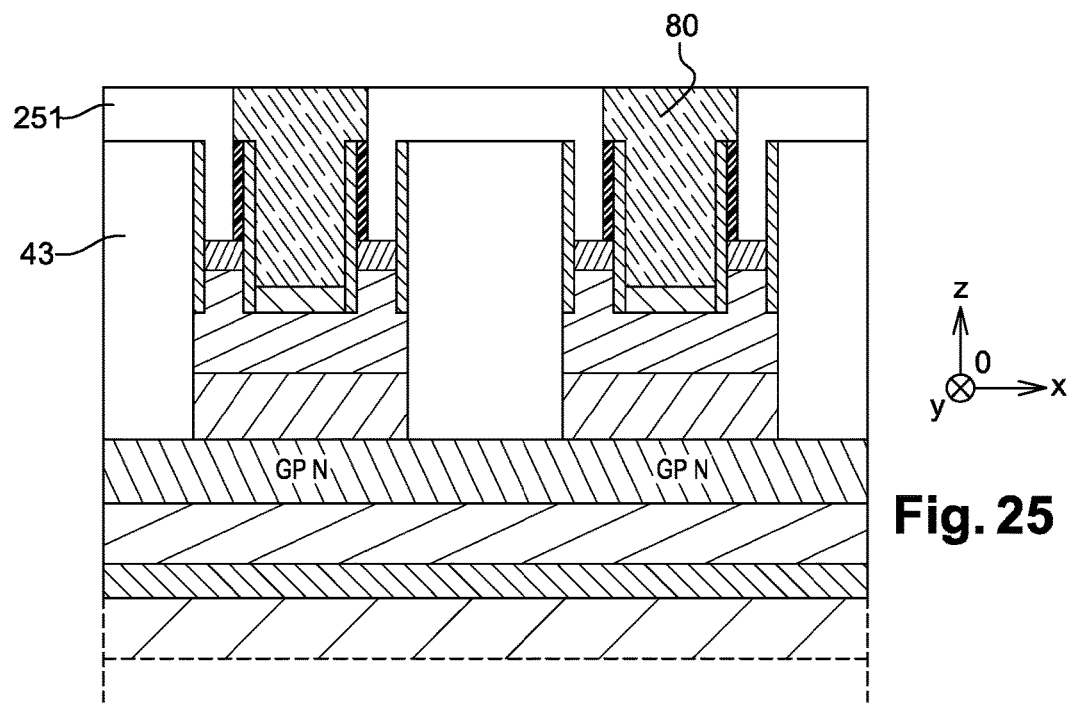

The sacrificial gate material 44 is then replaced by another conductive material 80, deposited so as to fill the holes and locations from which sacrificial gate material has been removed (FIG. 25 shows a section view along the axis AA'). CMP polishing is then carried out to planarize this material.

Then removal of the insulating material layer 251 and of the encapsulation layer 43 surrounding the islands 42a, 42c is carried out. This removal may be selective in terms of the material of the insulating layer 41 upon which these islands 42a, 42c rest.

Figure 26:
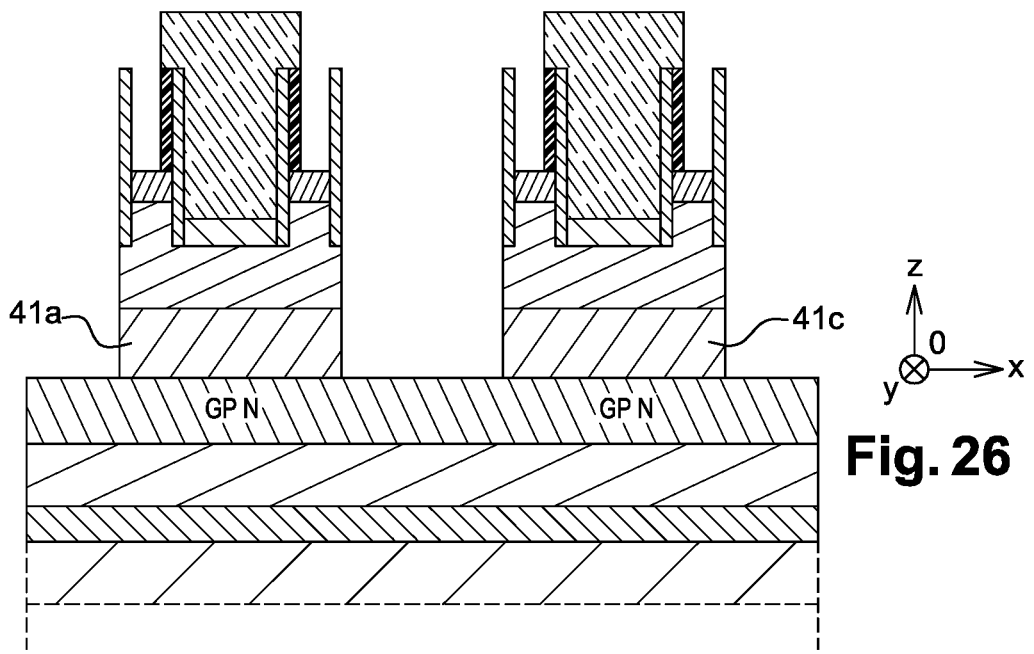

For example, when the insulating layer 41 is a thermal oxide whilst the insulating material 251 and the material of the encapsulation layer are based on a low-k type dielectric, the selective removal may be performed using wet etching. At the end of this selective etching the zones 41a and 41c of insulating layer 41 are retained beneath the islands 42a, 42c respectively (FIG. 26 shows a section view along axis AA').

Figure 27:
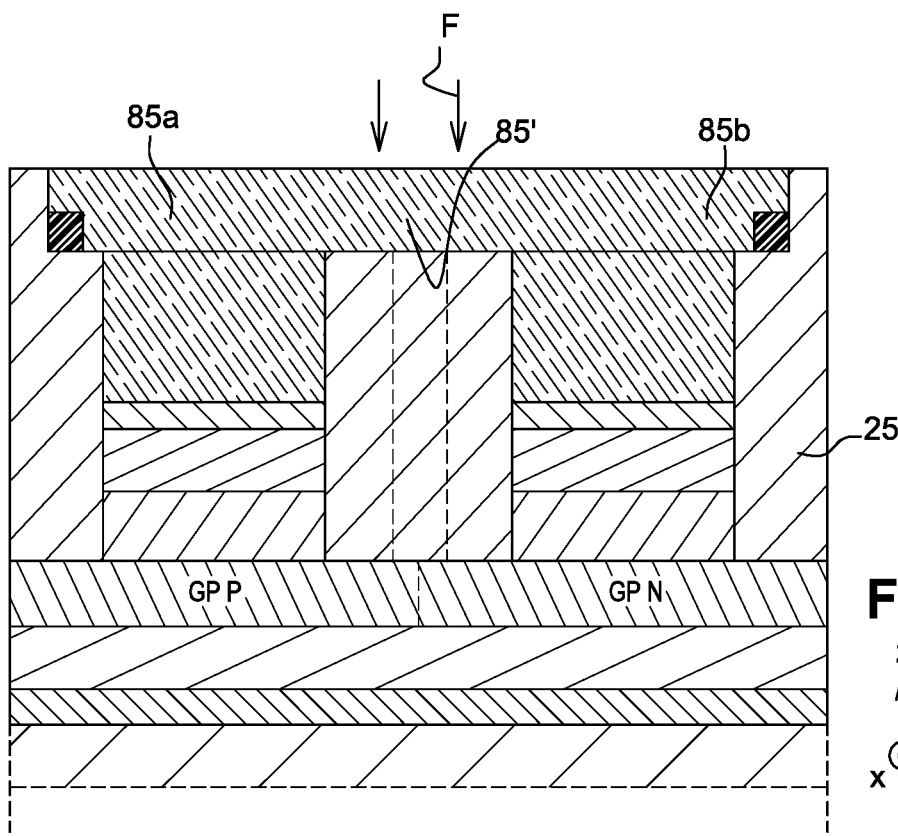

Then a replacement encapsulation layer 253 is made on the ground plane layer 40. The encapsulation layer 253 extends around the semiconductor islands 42a, 42b and in particular beneath a connection element 85' linking a gate 85b of a P type transistor and a gate 85a of an N type transistor. The encapsulation layer is, in this embodiment example, based on a silsesquioxane derivative $RSiO_{3/2}$, such as HSQ (Hydrogen silsesquioxane) (FIG. 27 shows a section view along axis BB'). An encapsulation layer based on such a material possesses little surface texture. The use of such a material to form the encapsulation layer 253 in particular avoids having to carry out a planarization step CMP.

Then a part of the HSQ-based encapsulation layer 253 arranged beneath the connection element 85' is then exposed to a laser beam or electron beam in accordance with the ground plane cutting pattern. This part extends up to the ground plane 40. The exposed part of the layer 253 of HSQ is subsequently selectively removed in order to form a trench 261 revealing the ground plane 40 continuous layer.

Figure 28A:
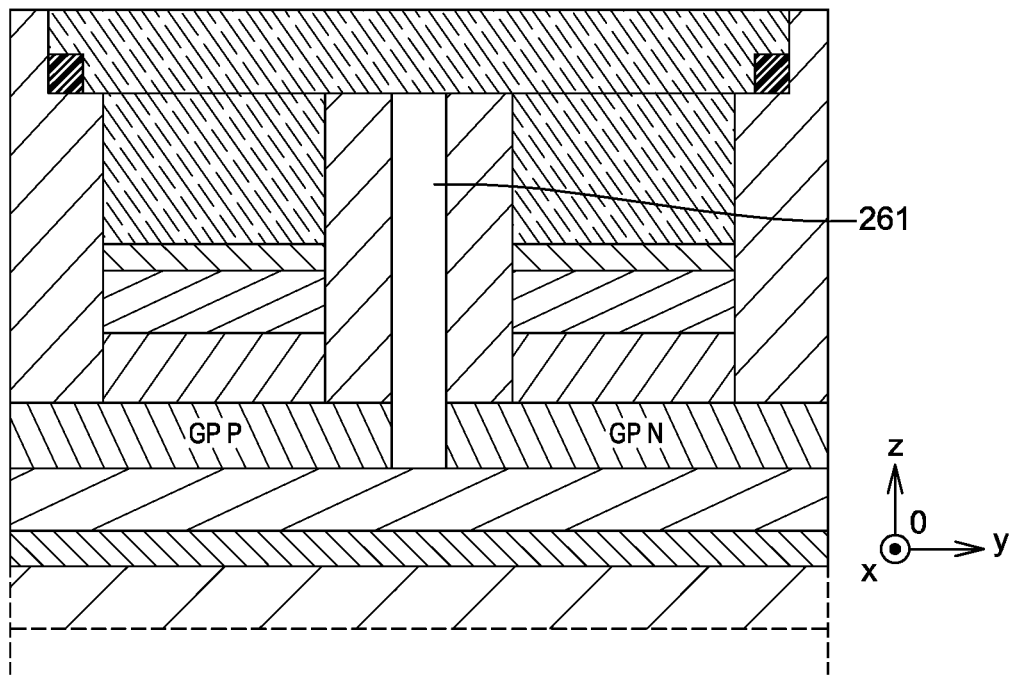
Figure 28B:
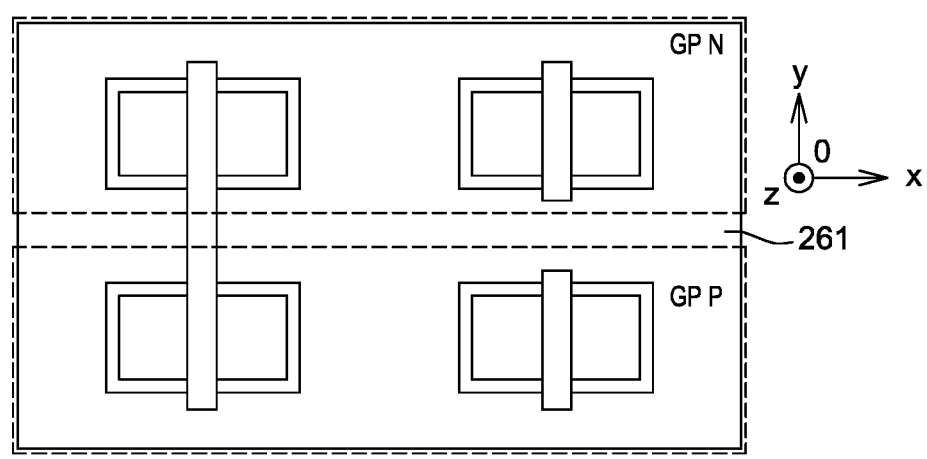

Cutting up of the ground plane continuous layer is then performed by extending the trench 261 (FIG. 28A shows a section view along axis BB', FIG. 28B shows a top view). When the ground plane layer 40 is made of polysilicon, selective etching using HBr or HCl may then be performed.

Then deposition of insulating material such as $SiO_2$ may be performed in order to fill in the holes in the structure. Planarization of this insulating material may then be implemented. The rest of the method may be performed in a manner such as described previously in association with FIGS. 17A-17B.

One or other of the particular embodiment examples which have just been described relate to the implementation of a 3D circuit equipped with a first level of transistors and a second level of transistors, but may also be applied to the implementation of a 3D circuit containing more than two levels.

Similarly, in the event of the 3D circuit comprising more than two levels of transistors, the ground plane layer acting as protection during one or more laser treatment steps may be provided at a level higher than the second level.

The invention claimed is:

1. Method for fabricating transistors for an integrated circuit equipped with several superimposed levels of transistors, comprising the following steps:
   a) forming, on a given level equipped with one or more transistors made at least partially in a first semiconductor layer: a stack comprising at least one first region of a second semiconductor layer suitable for receiving an N-type transistor channel and at least one second region of the second semiconductor zone suitable for receiving a P-type transistor channel of a level above the given level, where the stack moreover comprises a continuous layer made of conductive or doped semiconductor material and called the ground plane, as well as an insulating layer between the ground plane and the second semiconductor layer, then b) carrying out at least one thermal annealing for activation of source and drain region of said N type transistor and of said P type transistor by exposure to a laser, said source and drain regions being in the form of one or more doped zones of the second semiconductor layer and/or doped semiconductor blocks formed on the second semiconductor layer, where the source and drain regions exposed to the laser are located on the side of an upper face of the ground plane continuous layer, where the ground plane continuous layer is configured so as to protect from the laser a part of the circuit located on the side of a lower face of the ground plane continuous layer, then c) cutting up of the ground plane continuous layer into at least one first portion and at least one second portion separated from the first portion, where the first portion is configured to allow biasing of the first region, where the second portion is configured to allow biasing of the second region.

2. The method according to claim 1, wherein the ground plane continuous layer is based on doped semiconductor material, where the first portion is P doped, with the second portion being N doped.

3. The method according to claim 1, wherein the formation of the stack comprises the etching of the second semiconductor layer so as to form islands suitable for creating active zones of transistors, where the ground plane is kept continuous at the end of the etching.

4. The method according to claim 1, comprising, after formation of islands and prior to the activation of the source and drain regions of said transistor, the formation of a first sacrificial gate and of a second sacrificial gate, where the method moreover comprises, after performing the cutting up of the ground plane layer, steps for:
removal of sacrificial gates and their respective replacement with a first replacement gate and a second replacement gate.

5. The method according to claim 1, comprising, prior to the cutting up of the ground plane continuous layer, the formation of a first sacrificial gate and a second sacrificial gate and a sacrificial linking element between the first sacrificial gate and the second sacrificial gate, then:
performing the cutting up of the ground plane continuous layer by forming a trench between the first sacrificial gate and the second sacrificial gate, where the trench passes through the sacrificial linking element and the ground plane continuous layer so as to separate the first portion and the second portion,
filling the trench using at least one insulating material,
removal of the sacrificial gates and replacing them with, respectively, a first replacement gate, a second replacement gate, and a connection element linking the first replacement gate and the second replacement gate.

6. The method according to claim 5 wherein filling the trench comprises steps for:
the deposition of a layer of a first insulating material which lines the trench and covers the first sacrificial gate and the second sacrificial gate, then of a layer of a second insulating material on the first insulating material, so as to obtain said filling,
the method moreover comprising prior to the removal of the sacrificial gates:
planarization of the layer of second insulating material so as to remove the second insulating material facing the first sacrificial gate and the second sacrificial gate,
formation of holes in the layer of the first insulation material, where the holes reveal the first sacrificial gate and the second sacrificial gate.

7. The method according to claim 5 wherein the trench comprises a principal region of width $\Delta_2$ greater than the width L of the sacrificial gates and a narrowed region of width $\Delta_1 < \Delta_2$ of the sacrificial gates, where the narrowed region separates the first sacrificial gate and the second sacrificial gate.

8. The method according to claim 1, wherein the formation of the stack comprises the etching of the second semiconductor layer so as to form islands suitable for forming active zones of transistors, the method comprising, prior to cutting up of the ground plane continuous layer:
formation of a first sacrificial gate and a second sacrificial gate and a sacrificial linking element, where the islands and sacrificial gates are surrounded by a first encapsulation layer,
removal of the sacrificial gates and their replacement with, respectively, a first replacement gate, a second replacement gate, and a connection element linking the first replacement gate and the second replacement gate, then
removal of the first encapsulation layer and replacement with a second encapsulation layer based on silsesquioxane derivative $RSiO_{3/2}$, where the second encapsulation layer extends around the islands and beneath the connection element linking a gate of a P type transistor and a gate of an N type transistor,
exposing a block of the second encapsulation layer which extends between the connection element and the ground plane layer using a laser or electron beam,
removing this block so as to form a trench between the first replacement gate and the second replacement gate, where the trench passes through the connection element and the ground plane continuous layer,
the cutting up of the ground plane continuous layer into a first portion and at least one second portion separated from the first portion, being carried out by etching in the extension of the trench.

9. The method according to claim 1, wherein the exposure is performed using a UV laser with short pulses between 40 ns and 160 ns.

* * * * *